(12) United States Patent
Chen et al.

(10) Patent No.: US 9,379,739 B2
(45) Date of Patent: Jun. 28, 2016

(54) DEVICES AND METHODS FOR DATA RECOVERY OF CONTROL CHANNELS IN WIRELESS COMMUNICATIONS

(71) Applicant: QUALCOMM Incorporated, San Diego, CA (US)

(72) Inventors: Chulong Chen, San Jose, CA (US); Amith Vikram Chincholi, Sunnyvale, CA (US); Harish Venkatachari, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 51 days.

(21) Appl. No.: 14/591,473

(22) Filed: Jan. 7, 2015

(65) Prior Publication Data
US 2016/0043829 A1  Feb. 11, 2016

Related U.S. Application Data

(60) Provisional application No. 62/035,746, filed on Aug. 11, 2014.

(51) Int. Cl.
*H03M 13/17* (2006.01)
*H04L 1/00* (2006.01)
*H03M 13/00* (2006.01)
*H03M 13/09* (2006.01)

(52) U.S. Cl.
CPC .............. *H03M 13/17* (2013.01); *H03M 13/09* (2013.01); *H03M 13/616* (2013.01); *H04L 1/0057* (2013.01); *H04L 1/0061* (2013.01)

(58) Field of Classification Search
CPC ... H03M 13/17; H03M 13/616; H03M 13/09; H04L 1/0057; H04L 1/0061
See application file for complete search history.

(56) References Cited

U.S. PATENT DOCUMENTS 3,622,984 A * 11/1971 Eastman ............... H04L 1/0057
714/762
3,676,851 A *  7/1972 Eastman ............ G11B 20/1833
707/E17.039

(Continued)

FOREIGN PATENT DOCUMENTS

CN     1322063 A     11/2001

OTHER PUBLICATIONS

International Search Report and Written Opinion—PCT/US2015/042968—ISA/EPO—Oct. 16, 2015.

(Continued)

*Primary Examiner* — Joseph D Torres
(74) *Attorney, Agent, or Firm* — Loza & Loza LLP

(57) ABSTRACT

Aspects of the present disclosure provide an apparatus and methods for recovering data from a control channel in wireless communications. An apparatus decodes a CRC appended codeword to obtain a decoded codeword, and computes a first syndrome of the decoded codeword utilizing a parity check matrix. If the first syndrome is non-zero, The apparatus determines a location S and a length K of an error pattern in bits of the decoded codeword, an index set $\epsilon$ based on the values of S and K. A linear system is formed based on the parity check matrix and the error pattern in accordance with the index set $\epsilon$. The apparatus determines a solution of the linear system, wherein the solution includes an estimated error pattern. A recovered codeword can be determined by removing the estimated error pattern from the decoded codeword.

28 Claims, 11 Drawing Sheets

(56) References Cited

U.S. PATENT DOCUMENTS

| | | | | | |
|---|---|---|---|---|---|
| 4,059,825 | A | * | 11/1977 | Greene | H03M 13/17 375/371 |
| 4,494,234 | A | * | 1/1985 | Patel | H03M 13/151 714/757 |
| 4,959,834 | A | * | 9/1990 | Aikawa | H04L 7/048 375/371 |
| 4,979,173 | A | * | 12/1990 | Geldman | H03M 13/17 377/116 |
| 5,007,067 | A | * | 4/1991 | Ayanoglu | H04L 25/4908 375/267 |
| 5,140,595 | A | * | 8/1992 | Geldman | H03M 13/17 714/762 |
| 5,414,719 | A | * | 5/1995 | Iwaki et al. | G06F 7/724 708/492 |
| 5,734,663 | A | * | 3/1998 | Eggenberger | G11B 20/18 714/758 |
| 5,771,246 | A | * | 6/1998 | Weng | H03M 13/17 714/762 |
| 5,812,438 | A | * | 9/1998 | Lan et al. | G06F 7/724 708/492 |
| 5,917,670 | A | * | 6/1999 | Scaramuzzo | G11B 5/012 360/25 |
| 6,654,926 | B1 | * | 11/2003 | Raphaeli | H03M 13/451 714/780 |
| 7,089,464 | B2 | * | 8/2006 | Herley | H04L 1/1812 714/712 |
| 7,721,185 | B1 | * | 5/2010 | Feng | H03M 13/1515 714/784 |
| 2008/0016431 | A1 | * | 1/2008 | Lablans | H03M 13/09 714/777 |
| 2008/0016432 | A1 | * | 1/2008 | Lablans | H03M 13/1515 714/784 |
| 2008/0052597 | A1 | * | 2/2008 | Valliappan | H03M 13/1525 714/762 |
| 2008/0082896 | A1 | * | 4/2008 | Valliappan | H04L 1/0057 714/762 |
| 2009/0217140 | A1 | * | 8/2009 | Jo et al. | G06F 11/1068 714/785 |
| 2010/0023846 | A1 | * | 1/2010 | Wu | H04L 1/004 714/798 |
| 2014/0012399 | A1 | | 1/2014 | Berkmann et al. | |
| 2014/0056372 | A1 | | 2/2014 | Nammi | |
| 2014/0082462 | A1 | | 3/2014 | Pietraski et al. | |
| 2014/0153483 | A1 | | 6/2014 | Göransson et al. | |
| 2014/0211722 | A1 | | 7/2014 | Pietraski et al. | |

OTHER PUBLICATIONS

Mandelbaum D., et al., "Some Easily Decoded, Efficient, Burst Error Correcting Block Codes", Information and Control, Academic Press, New York, NY, US, vol. 23, No. 3, Oct. 1973, pp. 234-244, XP024889792, ISSN: 0019-9958, DOI: 10.1016/S0019-9958(73)90718-3 [retrieved on Oct. 1, 1973] p. 239, line 5—last line.

Rosnes E., et al., "Exploiting the CRC-CCITT Code on the Binary Erasure Channel", 6th International Symposium on Turbo Codes and Iterative Information Processing (ISTC), 2010, IEEE, Piscataway, NJ, USA, Sep. 6, 2010, pp. 344-348, XP031783851, ISBN: 978-1-4244-6744-0, abstract, Section III.C.

Wang R., et al., "CRC-Assisted Error Correction in a Convolutionally Coded System", ICC '06., 2006 International Conference on Communications, IEEE, Jun. 2006, pp. 79-83, XP031025034, ISBN: 978-1-4244-0354-7.

* cited by examiner

FIG. 11

Parity Check Matrix $H =$

DEVICES AND METHODS FOR DATA RECOVERY OF CONTROL CHANNELS IN WIRELESS COMMUNICATIONS

CROSS-REFERENCE TO RELATED APPLICATIONS

This application claims priority to and the benefit of provisional patent application No. 62/035,746 filed in the United States Patent and Trademark Office on 11 Aug. 2014, titled Devices and Methods for Reconstructing Corrupted Information and Cyclic Redundancy Check Bits in Control Channels, the entire content of which is incorporated herein by reference.

TECHNICAL FIELD

The technology discussed below relates generally to wireless communications, and more particularly, to data recovery of control channels in wireless communications.

BACKGROUND

Wireless communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). UMTS also supports enhanced 3G data communications protocols, such as High Speed Uplink Packet Access (HSUPA), High Speed Downlink Packet Access (HSDPA), and High Speed Packet Access (HSPA), which provide higher data transfer speeds and capacity to associated UMTS networks.

Some user equipment (UE) are capable of being simultaneously active on multiple networks using one or more radio access technologies (RATs) such as HSDPA and GSM. One example is a Dual-Sim Dual Active (DSDA) UE equipped with dual subscriber identity modules (SIMs) associated with respective networks. The DSDA UE can simultaneously communicate with multiple networks through one or more RATs. However, when the DSDA UE is actively communicating with one network, it may fail to receive the data from the control channels of the other network due to receiver desensitization (desense) caused by interference from the secondary RAT and voluntary erasure of received signals.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a method of recovering a codeword in wireless communications. The method includes receiving a cyclic redundancy check (CRC) appended codeword from a wireless channel; decoding the CRC appended codeword to obtain the decoded codeword; and computing a first syndrome of the decoded codeword utilizing a parity check matrix. If the first syndrome is non-zero, the method determines a location S and a length K of an error pattern in bits of the decoded codeword and an index set $\epsilon$ based on the values of S and K, and forms a linear system based on the parity check matrix and the error pattern in accordance with the index set $\epsilon$. The method further includes determining a solution of the linear system, wherein the solution includes an estimated error pattern; and determining a recovered codeword by removing the estimated error pattern from the decoded codeword.

Another aspect of the disclosure provides an apparatus configured to recover a codeword in wireless communications. The apparatus includes a codeword decoder configured to receive a cyclic redundancy check (CRC) appended codeword from a wireless channel and decode the CRC appended codeword to obtain the decoded codeword. The apparatus further includes a syndrome calculation block configured to compute a first syndrome of the decoded codeword utilizing a parity check matrix. The apparatus further includes an error pattern location block configured to if the first syndrome is non-zero, determine a location S and a length K of an error pattern in bits of the decoded codeword. The apparatus further includes an index set determination block configured to determine an index set $\epsilon$ based on the values of S and K. The apparatus further includes a linear system block configured to: form a linear system based on the parity check matrix and the error pattern in accordance with the index set $\epsilon$; determine a solution of the linear system, wherein the solution includes an estimated error pattern; and determine a recovered codeword by removing the estimated error pattern from the decoded codeword.

Another aspect of the disclosure provides an apparatus configured to recover a codeword in wireless communications. The apparatus includes means for receiving a cyclic redundancy check (CRC) appended codeword from a wireless channel. The apparatus further includes means for decoding the CRC appended codeword to obtain the decoded codeword. The apparatus further includes means for computing a first syndrome of the decoded codeword utilizing a parity check matrix. The apparatus further includes means for if the first syndrome is non-zero, determining a location S and a length K of an error pattern in bits of the decoded codeword. The apparatus further includes means for determining an index set $\epsilon$ based on the values of S and K. The apparatus further includes means for forming a linear system based on the parity check matrix and the error pattern in accordance with the index set $\epsilon$. The apparatus further includes means for determining a solution of the linear system, wherein the solution includes an estimated error pattern. The apparatus further includes means for determining a recovered codeword by removing the estimated error pattern from the decoded codeword.

Another aspect of the disclosure provides a computer-readable medium including instructions for recovering a codeword in wireless communications. The instructions cause an apparatus to receive a cyclic redundancy check (CRC) appended codeword from a wireless channel; decode the CRC appended codeword to obtain the decoded codeword;

and compute a first syndrome of the decoded codeword utilizing a parity check matrix. If the first syndrome is non-zero, the instructions cause the apparatus to determine a location S and a length K of an error pattern in bits of the decoded codeword; determine an index set $\epsilon$ based on the values of S and K; form a linear system based on the parity check matrix and the error pattern in accordance with the index set $\epsilon$; determine a solution of the linear system, wherein the solution includes an estimated error pattern; and determine a recovered codeword by removing the estimated error pattern from the decoded codeword.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Figure 11:
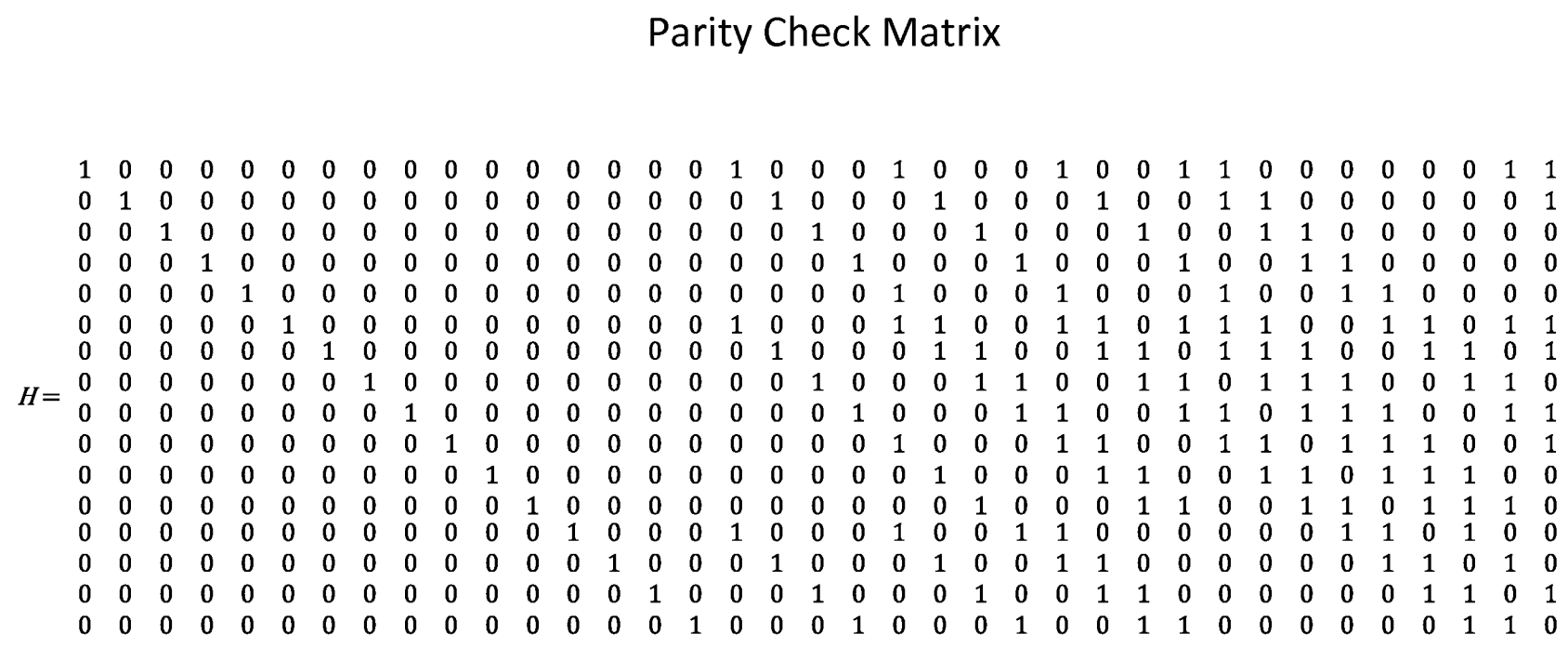

FIG. 11 illustrate an example of a parity check matrix in accordance with an aspect of the disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
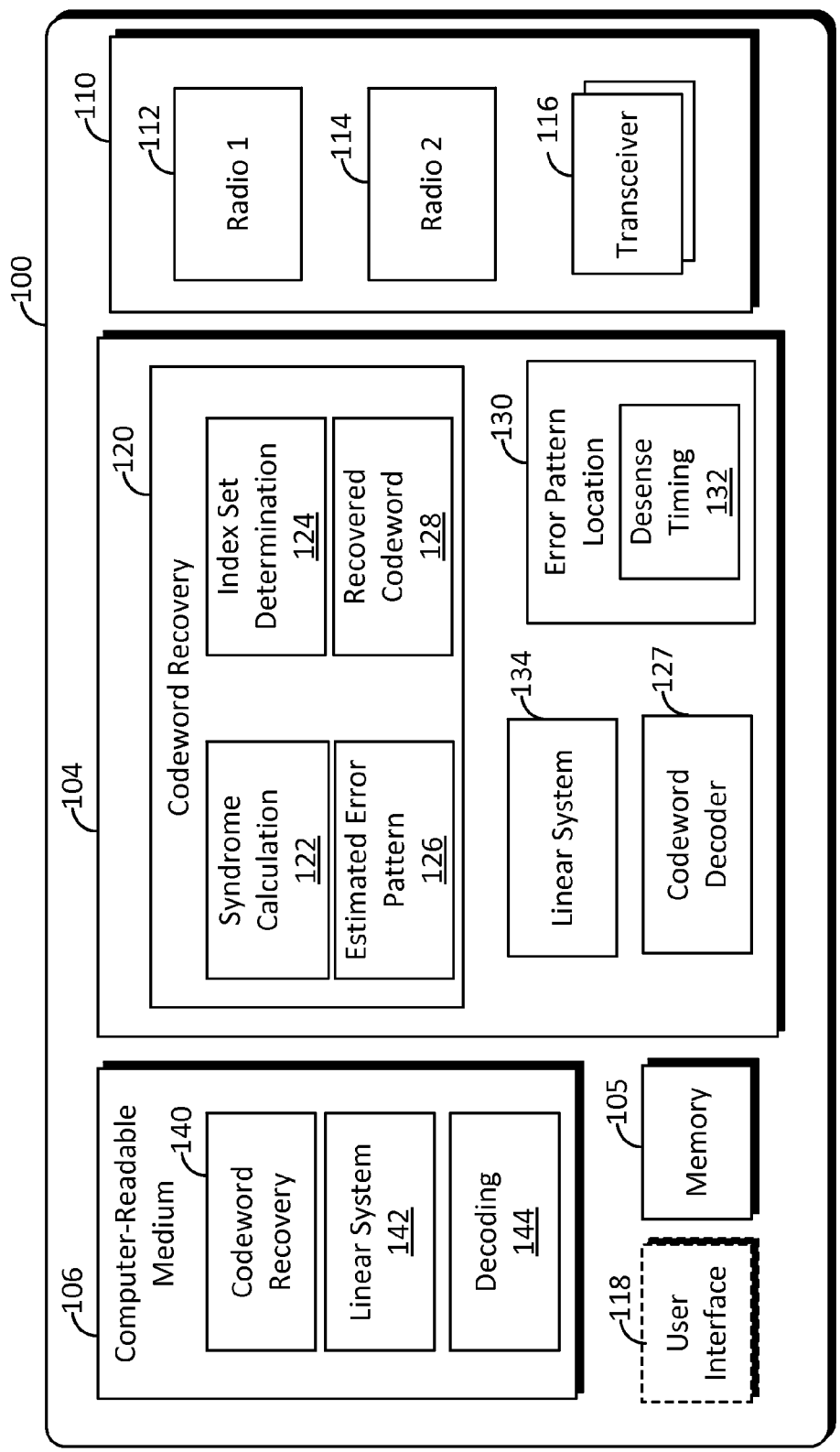
FIG. 1 is a block diagram illustrating an example of a hardware implementation for an apparatus configured to recover error bits in a decoded codeword in accordance with aspects of the disclosure.
Figure 2:
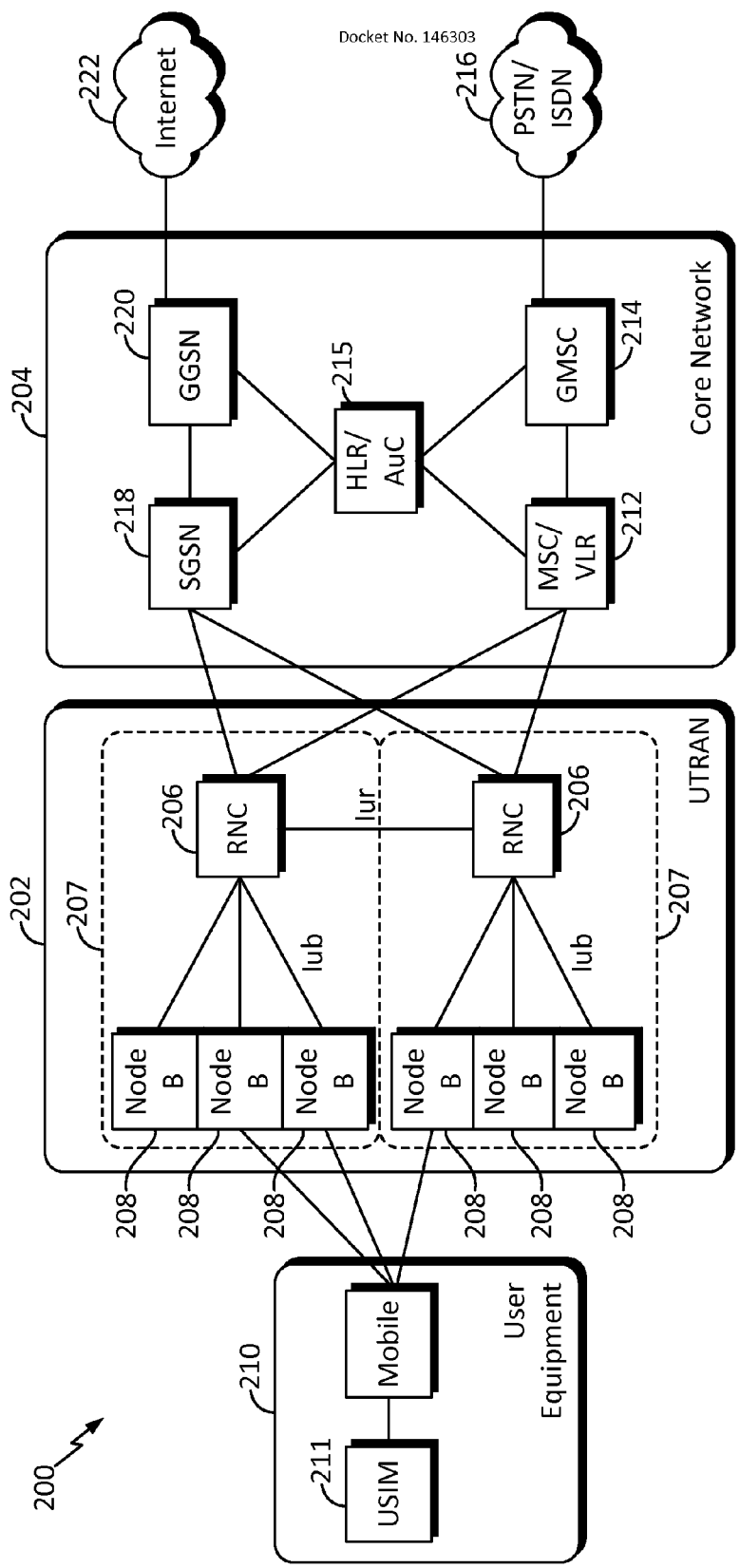
FIG. 2 is a block diagram conceptually illustrating an example of a telecommunications system in accordance with aspects of the disclosure.

FIG. 1 is a conceptual diagram illustrating an example of a hardware implementation for an apparatus 100 configured to recover error bits in a decoded codeword in accordance with aspects of the disclosure. In accordance with various aspects of the disclosure, an element, or any portion of an element, or any combination of elements may be implemented with the apparatus 100 that includes one or more processors 104. For example, the apparatus 100 may be a user equipment (UE) as illustrated in any one or more of FIGS. 2, 3, and/or 5. In another example, the apparatus 100 may be a Node B or a radio network controller (RNC) as illustrated in FIG. 2. In some examples, a wireless communications apparatus may be implemented with the apparatus 100. Examples of processors 104 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 104, as utilized in an apparatus 100, may be used to implement any one or more of the processes and functions described below and illustrated in FIGS. 6-10. The various components, blocks, circuitry of the apparatus, illustrated or not illustrated, in FIG. 1 and described herein may be implemented in software, firmware, hardware, and/or any combination thereof.

In this example, the apparatus may have a bus architecture. The bus may include any number of interconnecting buses and bridges depending on the specific application of the apparatus 100 or its processing system and the overall design constraints. The bus links together various circuits including one or more processors (represented generally by the processor 104), a memory 105, and computer-readable media (represented generally by the computer-readable medium 106). The bus may also link various other circuits such as timing sources, peripherals, voltage regulators, and power management circuits, which are well known in the art, and therefore, will not be described any further. A bus interface provides an interface between the bus and a communication interface 110. The apparatus 100 may utilize the communication interface 110 to communicate with other wireless devices utilizing one or more radio access technology (RAT) via one or more wireless channels. In one example, the communication interface 110 includes a first radio 112, a second radio 114, and one or more transceivers 116. The communication interface 110 provides a means for communicating with various other apparatus over a transmission medium or wireless channels. In some examples, such as a dual-SIM dual standby (DSDS) device, a dual-SIM dual active (DSDA) device, or other multi-SIM devices, the communication interface 110 may be configured to communicate with multiple networks utilizing one or more radio access technologies (RAT). Depending upon the nature of the apparatus, a user interface 118 (e.g., keypad, display, speaker, microphone, joystick, touchscreen, touchpad, gesture sensor) may also be provided to support user interaction.

In one aspect of the disclosure, the processor 104 includes a codeword recovery block 120 that can be configured to perform various codeword recovery functions described below and in reference to FIGS. 6-11. For example, the codeword recovery block 120 includes a syndrome calculation block 122 and an index set determination block 124. The codeword recovery block 120 may be utilized to determine an estimated error pattern 126 of a decoded codeword with error bits. The processor 104 has a codeword decoder 127 that can be configured to decode CRC appended codeword received from the first radio 112 and/or the second radio 112 via the transceiver 116. One example of a CRC appended codeword is an HS-SCCH codeword. For more information on HS-SCCH decoding, see Section 6A.1.1 in 3GPP TS 25.214, Physical Layer Procedures (FDD), release 12. The codeword recovery block 120 can be configured to remove an estimated error pattern 126 from a decoded codeword to generate a recovered codeword 128.

An error pattern location block 130 can be configured to determine the location and length of an error pattern (a block of error bits) in a decoded codeword. For example, the location and length of the error pattern (error bits) may be based on a desense timing 132 obtained from the first radio 112 and/or the second radio 114.

A linear system block 134 can be configured to perform various operations and functions involving linear equations, matrices, and vectors. By way of example but not limitation, the linear system block 134 can be utilized to solve linear equations, and perform multiplication, addition, and subtraction of matrices and vectors.

The processor 104 is also responsible for managing the bus and general processing, including the execution of software stored on the computer-readable medium 106. The software, when executed by the processor 104, causes the apparatus 100 to perform the various functions described below, for example in FIGS. 6-10, for any particular apparatus. The computer-readable medium 106 may also be used for storing data that is manipulated by the processor 104 when executing software.

One or more processors 104 in the processing system may execute software. The software when executed causes the apparatus 100 to perform the various functions and methods described in FIGS. 6-10. For example, codeword recovery instructions 140 when executed by the processor 104, can configure the apparatus 100 to perform the functions related to codeword recovery. Linear system handling instructions 142 when executed by the processor 104, can configure the apparatus 100 to perform the functions related to linear system, matrices, and vectors. Decoding instructions 144 when executed by the processor 104, can configure the apparatus 100 to perform the functions related to CRC appended codeword decoding (e.g., HS-SCCH codeword).

Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 106. The computer-readable medium 106 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 106 may reside in the apparatus 100, external to the apparatus 100, or distributed across multiple entities including the apparatus 100. The computer-readable medium 106 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The various concepts presented throughout this disclosure may be implemented across a broad variety of telecommunication systems, network architectures, and communication standards. Referring now to FIG. 2, as an illustrative example without limitation, various aspects of the present disclosure are illustrated with reference to a Universal Mobile Telecommunications System (UMTS) system 200. A UMTS network includes three interacting domains: a core network 204, a radio access network (RAN) (e.g., the UMTS Terrestrial Radio Access Network (UTRAN) 202), and a user equipment (UE) 210. The UE may be any of the UEs illustrated in FIGS. 1, 3, and/or 5. In some examples, the UE 210 may be a DSDA UE. Among several options available for a UTRAN 202, in this example, the illustrated UTRAN 202 may employ a W-CDMA air interface for enabling various wireless services including telephony, video, data, messaging, broadcasts, and/or other services. The UTRAN 202 may include a plurality of Radio Network Subsystems (RNSs) such as an RNS 207, each controlled by a respective Radio Network Controller (RNC) such as an RNC 206. Here, the UTRAN 202 may include any number of RNCs 206 and RNSs 207 in addition to the illustrated RNCs 206 and RNSs 207. The RNC 206 is an apparatus responsible for, among other things, assigning, reconfiguring, and releasing radio resources within the RNS 207. The RNC 206 may be interconnected to other RNCs (not shown) in the UTRAN 202 through various types of interfaces such as a direct physical connection, a virtual network, or the like using any suitable transport network.

The geographic region covered by the RNS 207 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 208 are shown in each RNS 207; however, the RNSs 207 may include any number of wireless Node Bs. The Node Bs 208 provide wireless access points to a core network 204 for any number of mobile apparatuses. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, a wearable computing device (e.g., a smartwatch, a health or fitness tracker, etc.), an appliance, a sensor, a vending machine, or any other similar functioning device. The mobile apparatus is commonly referred to as user equipment (UE) in UMTS applications, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. In a UMTS system, the UE 210 may further include a universal subscriber identity module (USIM) 211, which contains a user's subscription information to a network. The UE 210 may have one USIM 211, or in the case of a DSDS, DSDA, or other multi-SIM UE, a plurality of USIMs 211, which may be included in a SIM or multiple SIMs. For illustrative purposes, one UE 210 is shown in communication with a number of the Node Bs 208. The downlink (DL), also called the forward link, refers to the communication link from a Node B 208 to a UE 210 and the uplink (UL), also called the reverse link, refers to the communication link from a UE 210 to a Node B 208.

The core network 204 can interface with one or more access networks, such as the UTRAN 202. As shown, the core network 204 is a UMTS core network. However, as those skilled in the art will recognize, the various concepts presented throughout this disclosure may be implemented in a RAN, or other suitable access network, to provide UEs with access to types of core networks other than UMTS networks.

The illustrated UMTS core network 204 includes a circuit-switched (CS) domain and a packet-switched (PS) domain. Some of the circuit-switched elements are a Mobile services Switching Centre (MSC), a Visitor Location Register (VLR), and a Gateway MSC (GMSC). Packet-switched elements include a Serving GPRS Support Node (SGSN) and a Gateway GPRS Support Node (GGSN). Some network elements, like EIR, HLR, VLR, and AuC may be shared by both of the circuit-switched and packet-switched domains.

In the illustrated example, the core network 204 supports circuit-switched services with a MSC 212 and a GMSC 214. In some applications, the GMSC 214 may be referred to as a media gateway (MGW). One or more RNCs, such as the RNC 206, may be connected to the MSC 212. The MSC 212 is an apparatus that controls call setup, call routing, and UE mobility functions. The MSC 212 also includes a visitor location register (VLR) that contains subscriber-related information for the duration that a UE is in the coverage area of the MSC 212. The GMSC 214 provides a gateway through the MSC 212 for the UE to access a circuit-switched network 216. The GMSC 214 includes a home location register (HLR) 215 containing subscriber data, such as the data reflecting the details of the services to which a particular user has subscribed. The HLR is also associated with an authentication center (AuC) that contains subscriber-specific authentication data. When a call is received for a particular UE, the GMSC 214 queries the HLR 215 to determine the UE's location and forwards the call to the particular MSC serving that location.

The illustrated core network 204 also supports packet-switched data services with a serving GPRS support node (SGSN) 218 and a gateway GPRS support node (GGSN) 220. General Packet Radio Service (GPRS) is designed to provide packet-data services at speeds higher than those available with standard circuit-switched data services. The GGSN 220 provides a connection for the UTRAN 202 to a packet-based network 222. The packet-based network 222 may be the Internet, a private data network, or some other suitable packet-based network. The primary function of the GGSN 220 is to provide the UEs 210 with packet-based network connectivity. Data packets may be transferred between the GGSN 220 and the UEs 210 through the SGSN 218, which performs primarily the same functions in the packet-based domain as the MSC 212 performs in the circuit-switched domain.

The UTRAN air interface may be a spread spectrum Direct-Sequence Code Division Multiple Access (DS-CDMA) system, such as one utilizing the W-CDMA standards. The spread spectrum DS-CDMA spreads user data through multiplication by a sequence of pseudorandom bits called chips. The W-CDMA air interface for the UTRAN 202 is based on such DS-CDMA technology and additionally calls for a frequency division duplexing (FDD). FDD uses a different carrier frequency for the uplink (UL) and downlink (DL) between a Node B 208 and a UE 210. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles are equally applicable to a TD-SCDMA air interface or any other suitable air interface.

The wireless communication system 200 may also support a high speed packet access (HSPA) air interface between the UE 210 and the UTRAN 202, facilitating greater throughput and reduced latency for users. HSPA includes a series of enhancements to the 3G/W-CDMA air interface. Among other modifications over prior standards, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink or EUL).

For example, in Release 5 of the 3GPP family of standards, HSDPA was introduced. HSDPA utilizes as its transport channel the high-speed downlink shared channel (HS-DSCH), which may be shared by several UEs. The HS-DSCH is implemented by three physical channels: the high-speed physical downlink shared channel (HS-PDSCH), the high-speed shared control channel (HS-SCCH), and the high-speed dedicated physical control channel (HS-DPCCH). Throughout this specification, these channels may generally be referred to as wireless channels.

The HS-SCCH is a physical channel that may be utilized to carry downlink control information related to the transmission of HS-DSCH. Here, the HS-DSCH may be associated with one or more HS-SCCH. The UE may continuously monitor the HS-SCCH to determine when to read its data from the HS-DSCH and to determine the modulation scheme used on the assigned physical channel.

The HS-PDSCH is a physical channel that may be shared by several UEs and may carry downlink data for the high-speed downlink. The HS-PDSCH may support quadrature phase shift keying (QPSK), 16-quadrature amplitude modulation (16-QAM), and multi-code transmission.

The HS-DPCCH is an uplink physical channel that may carry feedback from the UE to assist the Node B in its scheduling algorithm. The feedback may include a channel quality indicator (CQI) and a positive or negative acknowledgement (ACK/NAK) of a previous HS-DSCH transmission.

One difference on the downlink between Release-5 HSDPA and the previously standardized circuit-switched air-interface is the absence of soft handover in HSDPA. This means that HSDPA channels are transmitted to the UE from a single cell called the HSDPA serving cell. As the user moves, or as one cell becomes preferable to another, the HSDPA serving cell may change. Still, the UE may be in soft handover on the associated DPCH, receiving the same information from plural cells.

In Release 5 HSDPA, at any instance a UE 210 has one serving cell: the strongest cell in the active set as according to the UE measurements of $E_c/I_0$. According to mobility procedures defined in Release 5 of 3GPP Technical Specification (TS) 25.331, the radio resource control (RRC) signaling messages for changing the HSPDA serving cell are transmitted from the current HSDPA serving cell (i.e., the source cell) and not the cell that the UE reports as being the stronger cell (i.e., the target cell).

Figure 3:
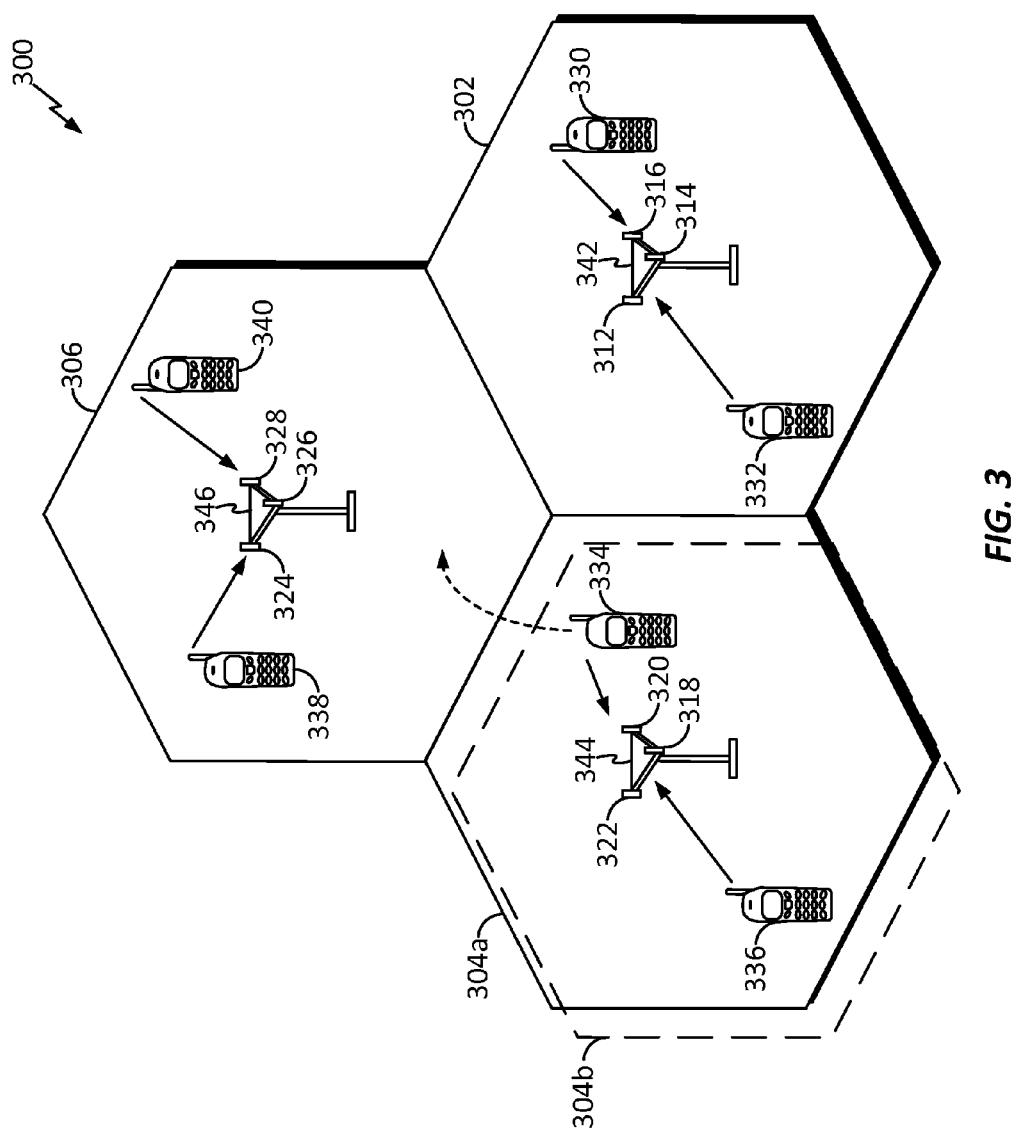
FIG. 3 is a diagram illustrating an example of an access network in accordance with aspects of the disclosure.

The UTRAN 202 is one example of a RAN that may be utilized in accordance with the present disclosure. Referring to FIG. 3, by way of example and without limitation, a simplified schematic illustration of a RAN 300 in a UTRAN architecture is illustrated. The system includes multiple cellular regions (cells), including cells 302, 304, and 306, each of which may include one or more sectors. Cells may be defined geographically (e.g., by coverage area) and/or may be defined in accordance with a frequency, scrambling code, etc. That is, the illustrated geographically-defined cells 302, 304, and 306 may each be further divided into a plurality of cells, e.g., by utilizing different scrambling codes. For example, cell 304*a* may utilize a first scrambling code, and cell 304*b*, while in the same geographic region and served by the same Node B 344, may be distinguished by utilizing a second scrambling code.

In a cell that is divided into sectors, the multiple sectors within a cell can be formed by groups of antennas with each antenna responsible for communication with UEs in a portion of the cell. For example, in cell 302, antenna groups 312, 314, and 316 may each correspond to a different sector. In cell 304, antenna groups 318, 320, and 322 may each correspond to a different sector. In cell 306, antenna groups 324, 326, and 328 may each correspond to a different sector.

The cells 302, 304, and 306 may include several UEs that may be in communication with one or more sectors of each cell 302, 304, or 306. For example, UEs 330 and 332 may be in communication with Node B 342, UEs 334 and 336 may be in communication with Node B 344, and UEs 338 and 340 may be in communication with Node B 346. Here, each Node B 342, 344, and 346 may be configured to provide an access point to a core network 204 (see FIG. 2) for all the UEs 330, 332, 334, 336, 338, and 340 in the respective cells 302, 304, and 306. The UEs illustrated in FIG. 3 may be any of the UEs illustrated in FIGS. 1, 2, and/or 5.

During a call with a source cell, or at any other time, the UE 336 may monitor various parameters of the source cell as well as various parameters of neighboring cells. Further, depending on the quality of these parameters, the UE 336 may maintain communication with one or more of the neighboring cells. During this time, the UE 336 may maintain an Active Set, that is, a list of cells to which the UE 336 is simultaneously connected (i.e., the UTRAN cells that are currently assigning a downlink dedicated physical channel DPCH or fractional downlink dedicated physical channel F-DPCH to the UE 336 may constitute the Active Set).

In a wireless telecommunication system, the communication protocol architecture may take on various forms depending on the particular application. For example, in a 3GPP UMTS system, the signaling protocol stack is divided into a Non-Access Stratum (NAS) and an Access Stratum (AS). The NAS provides the upper layers, for signaling between the UE 210 and the core network 204 (referring to FIG. 2), and may include circuit switched and packet switched protocols. The AS provides the lower layers, for signaling between the UTRAN 202 and the UE 210, and may include a user plane and a control plane. Here, the user plane or data plane carries user traffic, while the control plane carries control information (i.e., signaling).

Figure 4:
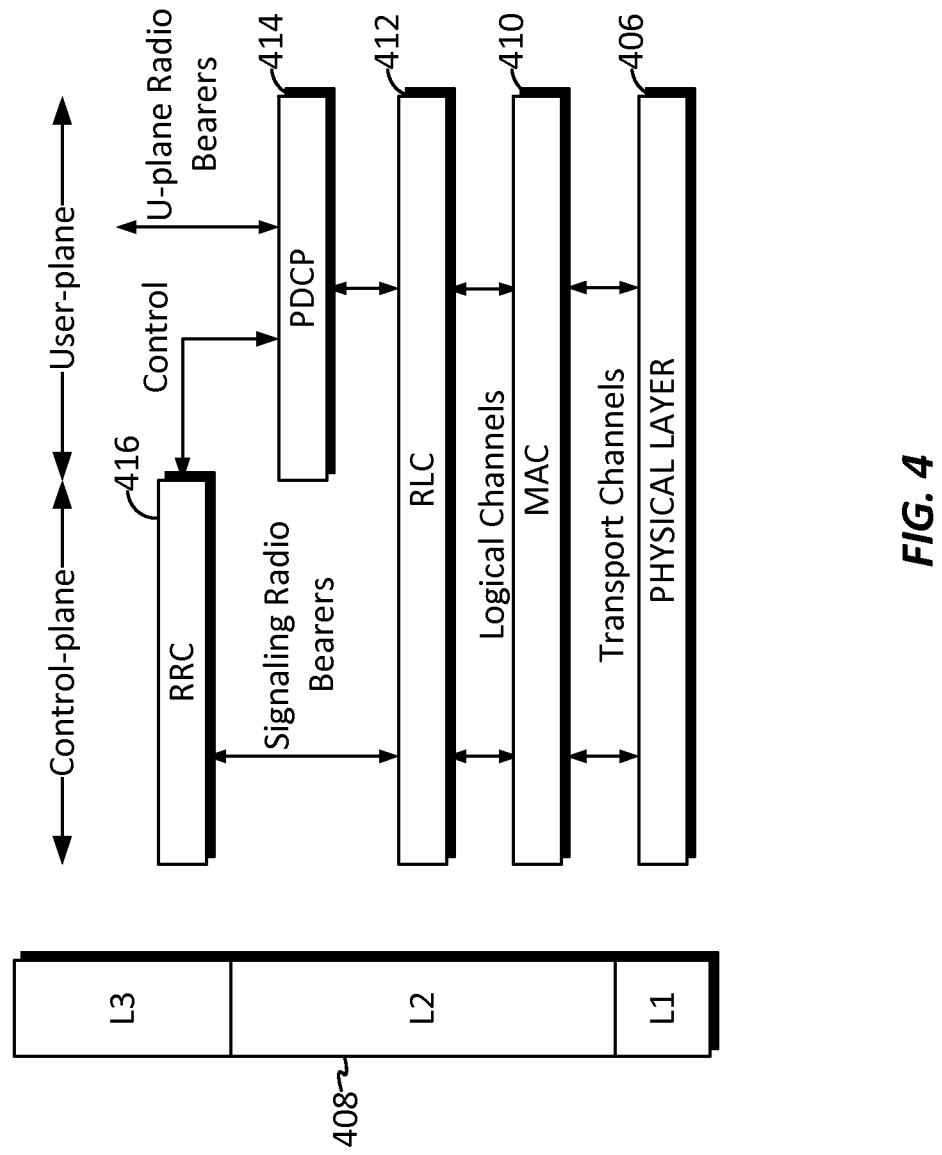
FIG. 4 is a diagram illustrating an example of a radio protocol architecture for the user and control plane in accordance with aspects of the disclosure.

Turning to FIG. 4, the AS is shown with three layers: Layer 1, Layer 2, and Layer 3. Layer 1 is the lowest layer and implements various physical layer signal processing functions. Layer 1 will be referred to herein as the physical layer 406. The data link layer, called Layer 2 408, is above the physical layer 406 and is responsible for the link between the UE 210 and Node B 208 over the physical layer 406.

At Layer 3, the RRC layer 416 handles the control plane signaling between the UE 210 and the Node B 208. RRC layer 416 includes a number of functional entities for routing higher layer messages, handling broadcasting and paging functions, establishing and configuring radio bearers, etc.

In the illustrated air interface, the L2 layer 408 is split into sublayers. In the control plane, the L2 layer 408 includes two sublayers: a medium access control (MAC) sublayer 410 and a radio link control (RLC) sublayer 412. In the user plane, the L2 layer 408 additionally includes a packet data convergence protocol (PDCP) sublayer 414. Although not shown, the UE may have several upper layers above the L2 layer 408 including a network layer (e.g., IP layer) that is terminated at a PDN gateway on the network side and an application layer that is terminated at the other end of the connection (e.g., far end UE, server, etc.).

The PDCP sublayer 414 provides multiplexing between different radio bearers and logical channels. The PDCP sublayer 414 also provides header compression for upper layer data packets to reduce radio transmission overhead, security by ciphering the data packets, and handover support for UEs between Node Bs.

The RLC sublayer 412 generally supports an acknowledged mode (AM) (where an acknowledgment and retransmission process may be used for error correction), an unacknowledged mode (UM), and a transparent mode for data transfers, and provides segmentation and reassembly of upper layer data packets and reordering of data packets to compensate for out-of-order reception due to a hybrid automatic repeat request (HARQ) at the MAC layer. In the acknowledged mode, RLC peer entities such as an RNC and a UE may exchange various RLC protocol data units (PDUs) including RLC Data PDUs, RLC Status PDUs, and RLC Reset PDUs, among others. In the present disclosure, the term "packet" may refer to any RLC PDU exchanged between RLC peer entities.

The MAC sublayer 410 provides multiplexing between logical and transport channels. The MAC sublayer 410 is also responsible for allocating the various radio resources (e.g., resource blocks) in one cell among the UEs. The MAC sublayer 410 is also responsible for HARQ operations. In some examples, the MAC sublayer 410 may include various MAC entities, including but not limited to a MAC-d entity and MAC-hs/ehs entity. The RNC houses protocol layers from MAC-d and above. For the high speed (HS) channels, the MAC-hs/ehs layer is housed in the Node B.

From the UE side, The MAC-d entity is configured to control access to all the dedicated transport channels, to a MAC-c/sh/m entity, and to the MAC-hs/ehs entity. Further, from the UE side, the MAC-hs/ehs entity is configured to handle the HSDPA specific functions and control access to the HS-DSCH transport channel. Upper layers configure which of the two entities, MAC-hs or MAC-ehs, is to be applied to handle HS-DSCH functionality.

Figure 5:
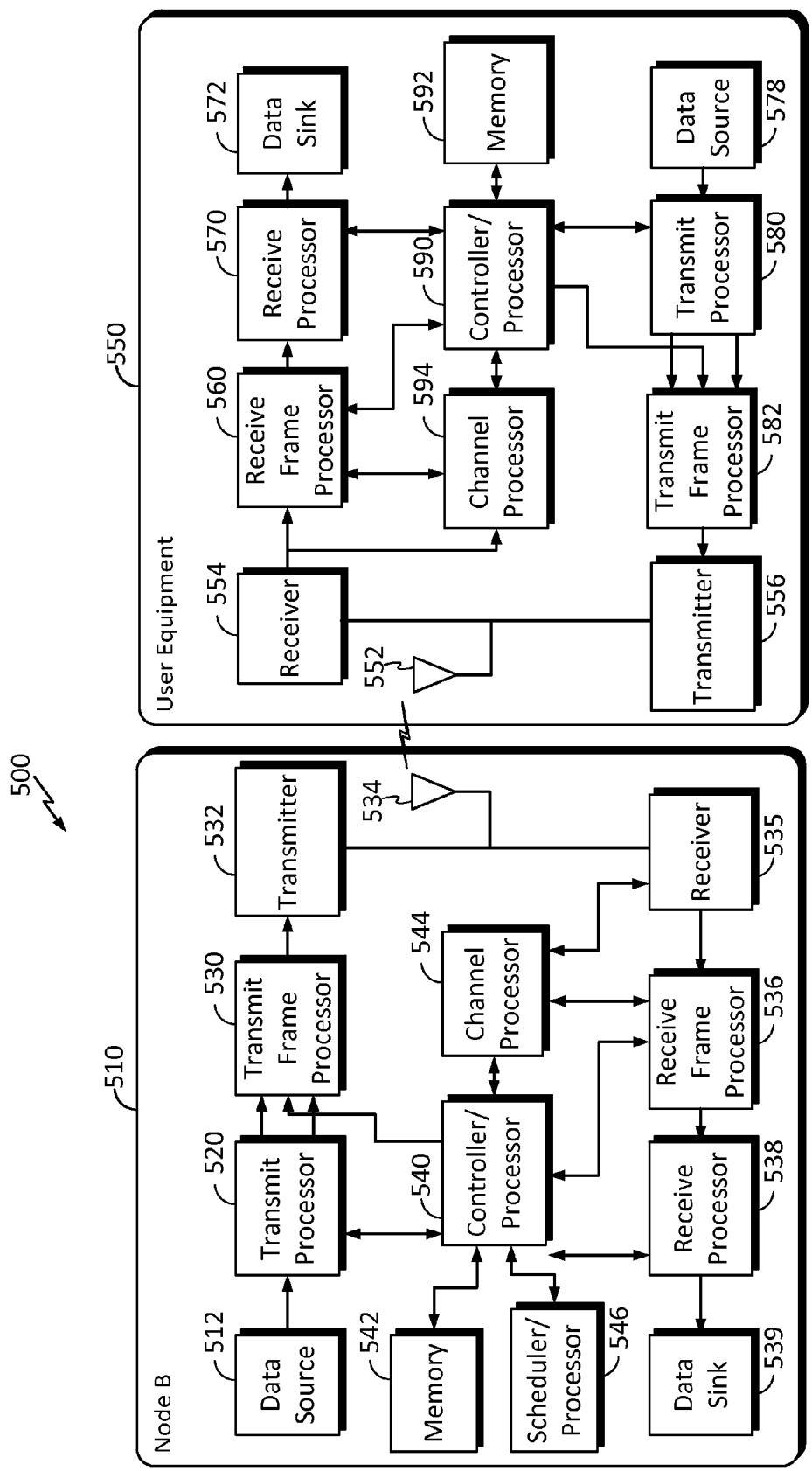
FIG. 5 is a block diagram illustrating an example of a Node B in communication with a user equipment (UE) in a telecommunications system.

FIG. 5 is a block diagram of an exemplary Node B 510 in communication with an exemplary UE 550, where the Node B 510 may be the Node B 208 in FIG. 2. In some examples, the UE 550 may be any of the UEs illustrated in FIGS. 1, 2, and/or 3. In the downlink communication, a transmit processor 520 may receive data from a data source 512 and control signals from a controller/processor 540. The transmit processor 520 provides various signal processing functions for the data and control signals, as well as reference signals (e.g., pilot signals). For example, the transmit processor 520 may provide cyclic redundancy check (CRC) codes for error detection, coding and interleaving to facilitate forward error correction (FEC), mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. Channel estimates from a channel processor 544 may be used by a controller/processor 540 to determine the coding, modulation, spreading, and/or scrambling schemes for the transmit processor 520. These channel estimates may be derived from a reference signal transmitted by the UE 550 or from feedback from the UE 550. The symbols generated by the transmit processor 520 are provided to a transmit frame processor 530 to create a frame structure. The transmit frame processor 530 creates this frame structure by multiplexing the symbols with information from the controller/processor 540, resulting in a series of frames. The frames are then provided to a transmitter 532, which provides various signal conditioning functions including amplifying, filtering, and modulating the frames onto a carrier for downlink transmission over the wireless medium through antenna 534. The antenna 534 may include one or more antennas, for example, including beam steering bidirectional adaptive antenna arrays or other similar beam technologies.

At the UE 550, a receiver 554 receives the downlink transmission through an antenna 552 and processes the transmission to recover the information modulated onto the carrier. The information recovered by the receiver 554 is provided to a receive frame processor 560, which parses each frame, and provides information from the frames to a channel processor 594 and the data, control, and reference signals to a receive processor 570. The receive processor 570 then performs the inverse of the processing performed by the transmit processor 520 in the Node B 510. More specifically, the receive processor 570 descrambles and despreads the symbols, and then determines the most likely signal constellation points transmitted by the Node B 510 based on the modulation scheme. These soft decisions may be based on channel estimates computed by the channel processor 594. The soft decisions are then decoded and deinterleaved to recover the data, control, and reference signals. The CRC codes are then checked to determine whether the frames were successfully decoded. The data carried by the successfully decoded frames will then be provided to a data sink 572, which represents applications running in the UE 550 and/or various user interfaces (e.g., display). Control signals carried by successfully decoded frames will be provided to a controller/processor 590. When frames are unsuccessfully decoded by the receiver processor 570, the controller/processor 590 may also use an acknowledgement (ACK) and/or negative acknowledgement (NACK) protocol to support retransmission requests for those frames.

In the uplink, data from a data source 578 and control signals from the controller/processor 590 are provided to a transmit processor 580. The data source 578 may represent applications running in the UE 550 and various user interfaces (e.g., keyboard). Similar to the functionality described in connection with the downlink transmission by the Node B 510, the transmit processor 580 provides various signal processing functions including CRC codes, coding and interleaving to facilitate FEC, mapping to signal constellations, spreading with OVSFs, and scrambling to produce a series of symbols. Channel estimates, derived by the channel processor 594 from a reference signal transmitted by the Node B 510 or from feedback contained in the midamble transmitted by the Node B 510, may be used to select the appropriate coding, modulation, spreading, and/or scrambling schemes. The symbols produced by the transmit processor 580 will be provided to a transmit frame processor 582 to create a frame structure. The transmit frame processor 582 creates this frame structure by multiplexing the symbols with information from the controller/processor 590, resulting in a series of frames. The frames are then provided to a transmitter 556, which provides various signal conditioning functions including amplification, filtering, and modulating the frames onto a carrier for uplink transmission over the wireless medium through the antenna 552.

The uplink transmission is processed at the Node B 510 in a manner similar to that described in connection with the receiver function at the UE 550. A receiver 535 receives the uplink transmission through the antenna 534 and processes the transmission to recover the information modulated onto the carrier. The information recovered by the receiver 535 is provided to a receive frame processor 536, which parses each frame, and provides information from the frames to the channel processor 544 and the data, control, and reference signals to a receive processor 538. The receive processor 538 performs the inverse of the processing performed by the transmit processor 580 in the UE 550. The data and control signals carried by the successfully decoded frames may then be provided to a data sink 539 and the controller/processor, respectively. If some of the frames were unsuccessfully decoded by the receive processor, the controller/processor 540 may also use an acknowledgement (ACK) and/or negative acknowledgement (NACK) protocol to support retransmission requests for those frames.

The controller/processors 540 and 590 may be used to direct the operation at the Node B 510 and the UE 550, respectively. For example, the controller/processors 540 and 590 may provide various functions including timing, peripheral interfaces, voltage regulation, power management, and other control functions. The computer readable media of memories 542 and 592 may store data and software for the Node B 510 and the UE 550, respectively. A scheduler/processor 546 at the Node B 510 may be used to allocate resources to the UEs and schedule downlink and/or uplink transmissions for the UEs.

Referring back to FIG. 2, the wireless communication system 200 may support HSDPA operations. In the operation of an HSDPA enabled wireless network, the HS-SCCH channel is used to carry physical layer and MAC-hs layer control information. A UE (e.g., UE 210 of FIG. 2) uses this control information to decode the associated HS-DSCH channel, which is mapped to one or more HS-PDSCH channels. Each HS-SCCH block or PDU has a three-slot duration that is divided into two functional parts, namely, Part 1 and Part 2 (see FIG. 8). Part 1 carries the time-critical information that is used to start the demodulation process in due time to avoid chip-level buffering. Part 2 contains less time-critical parameters, including a CRC code to check the validity of the HS-SCCH information and HARQ process information. For example, the CRC bits (e.g., sixteen CRC bits) are generated from both the Part 1 and Part 2 information bits, inverted and XOR'ed (i.e., exclusive OR operation) with the H-RNTI (HS-DSCH Radio Network Transaction Identifier) of the intended UE. In general, if the HS-SCCH CRC check fails, the HS-SCCH may be treated as a discontinuous transmission (DTX) and the corresponding HS-PDSCH decoding will not be attempted.

In one aspect of the disclosure, the UE may be a DSDA device 210, and it can be simultaneously active using HSDPA (first RAT) and one or more other second RAT(s) in a UMTS system 200. In this case, there is a possibility of desensing the HSDPA by another RAT, where symbols or data received using HSDPA of the first RAT may be corrupted or lost due to interference from the transmission of the other RAT (e.g., a GSM transmission). In such a case, a portion of the HS-SCCH data may be corrupted, resulting in the loss of the associated HS-PDSCH data. Typically, the operation of different RATs at a DSDA UE is not cooperative (e.g., time coordinated). Therefore, the location of the HS-SCCH data (e.g., Part 1, Part 2, or any combinations of Part 1 and Part 2 of FIG. 8) affected by desense, from the perspective of the HSDPA side, appears to be random in each transmission time interval (TTI).

Aspects of the present disclosure provide an algorithm that can recover corrupted or lost HS-SCCH data by using certain properties of the CRC bits present in Part 2 of the HS-SCCH data. It enables the associated HS-DSCH to be demodulated and decoded even if a contiguous portion (i.e., information bits and/or CRC bits) of the HS-SCCH was not properly received by the UE. Therefore, a UE can successfully decode the HS-SCCH even when a significant part of the HS-SCCH data is corrupted (e.g., desensed by the transmission of the other RAT at a DSDA UE). All data bits (information and CRC bits) of the HS-SCCH may be treated equally, and hence they can be used to recover the control channels even when the CRC bits are also corrupted. However, the present disclosure is not limited to HS-SCCH and HS-DSCH recovery or any particular wireless communications standard. To the contrary, the inventive concept and technique of the present disclosure may be applied to recover other control channels that employ CRC techniques for error detection.

Aspects of the present disclosure use certain properties of CRC correction techniques to recover corrupted HS-SCCH data including information and/or CRC bits. A valid CRC appended codeword c (i.e., information data bits and appended CRC bits) falls in the null-space of the corresponding parity check matrix H (e.g., see FIG. 11), meaning that multiplying the valid CRC appended codeword c by H results in an all-zero vector. Otherwise, if the CRC appended codeword is not valid, a non-zero syndrome would be obtained. For any vector x, $s=Hx^T$ is called the syndrome of x. That is the syndrome of the vector x is equal to the parity check matrix H multiplied by the transpose of the vector x. The vector x is a valid codeword if and only if s=0. In aspects of the present disclosure, the columns in the parity check matrix H corresponding to the lost bits may be activated in a syndrome calculation. Activated columns are those actually contributed to the calculation of the syndrome. Only columns corresponding to the non-zero bits in the error pattern are activated during the computation. If the lost (or corrupted) bits are contiguous, and the span of the lost portion is less than a predetermined number of bits (e.g., 16 bits for a 16-bit CRC appended codeword), the parity check equations may have a unique solution. In aspects of the present disclosure, if a contiguous portion of a codeword is lost, and the location of the lost portion is known, an algorithm disclosed in the present disclosure can recover the lost or corrupted bits.

Figure 6:
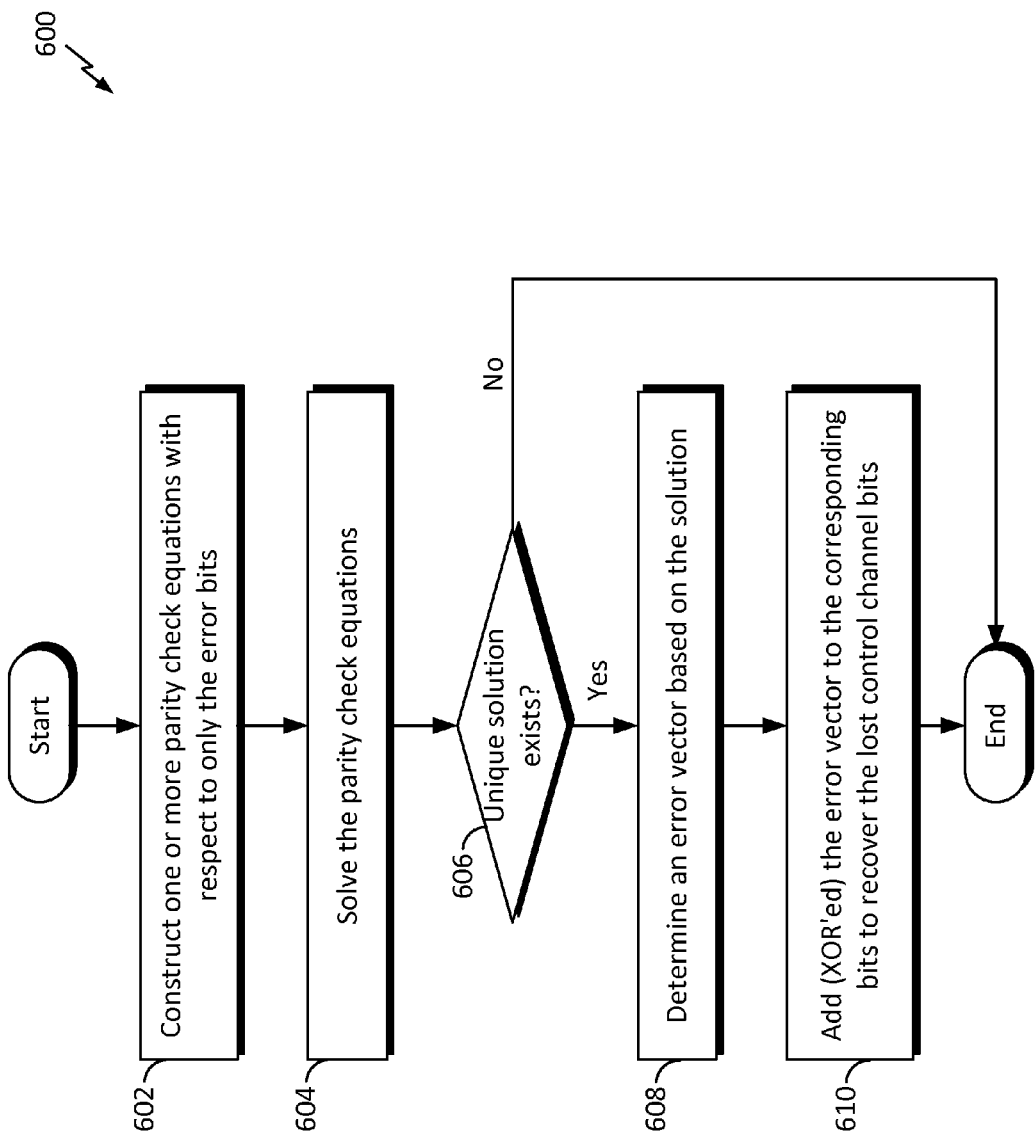
FIG. 6 is a flow chart illustrating a method of recovering error bits of a cyclic redundancy check (CRC) appended codeword in accordance with aspects of the present disclosure.

FIG. 6 is a flow chart illustrating a method 600 of recovering error bits of a CRC appended codeword in accordance with aspects of the present disclosure. The method 600 may be performed by any of the UEs illustrated in FIGS. 1, 2, 3, and/or 5 or any suitable apparatus. In one example, the CRC appended codeword may be an HS-SCCH codeword. At block 602, one or more parity check equations with respect to the error bits (lost or corrupted) are constructed. In one example, the parity check equations may be represented as Equation 1 below. The parity check equations will be described in more detail below. In one aspect of the disclosure, a UE (e.g., a DSDA UE) may utilize a linear system block 134 to construct the parity check equations. At block 604, the parity check equations are solved. For example, the UE may utilize the linear system block 134 to solve the linear equations. At decision block 606, if a unique solution is found for the parity check equations, the method 600 proceeds to block 608 where an error vector is determined based on the unique solution. For example, a UE may utilize the linear system block 134 to determine the error vector. At block 610, the error vector is added (e.g., XOR'ed) to the corresponding bits of the received codeword to recover the lost bits. For example, a UE may utilize the linear system block 134 to add the error vector to the codeword. Each of these blocks of FIG. 6 may involve multiple steps or procedures, which will be described in more detail below.

Figure 7:
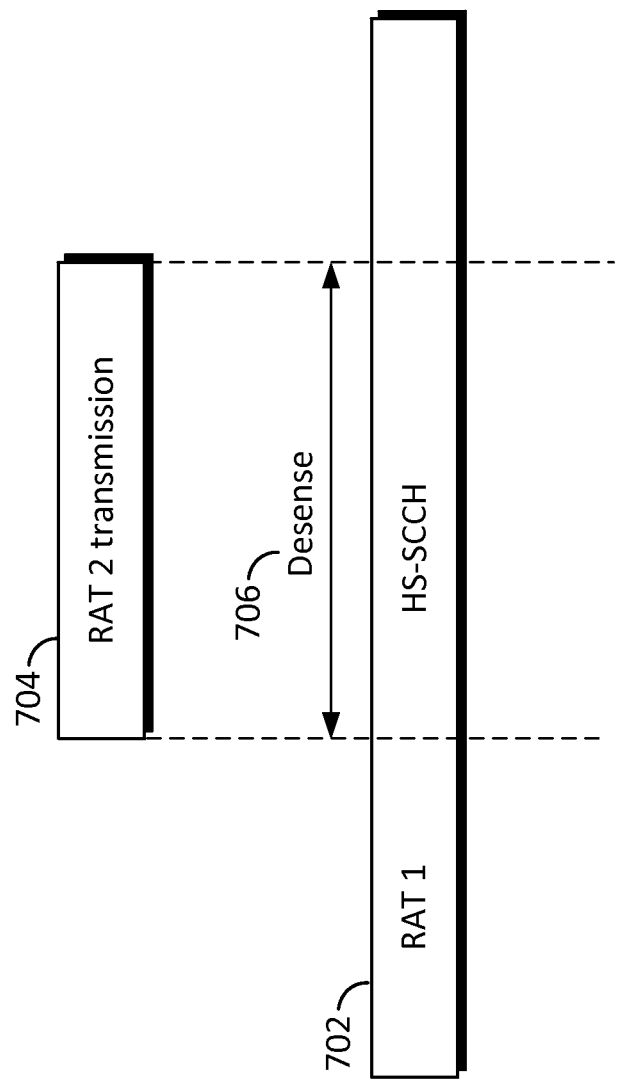
FIG. 7 is a drawing illustrating desense between a transmission of a first radio access technology (RAT) and a transmission of a second RAT in accordance with aspects of the disclosure.

Some aspects of the present disclosure will be illustrated with a DSDA UE capable of simultaneously communicating using a first RAT and a second RAT. Referring to FIG. 7, for example, the first RAT 702 may support HSDPA, and the second RAT 704 may be GSM. The transmission of packets utilizing the second RAT may overlap with some parts of the HSDPA activities and cause desense in the HSDPA receiver chain. If only HS-SCCH information bits are affected or lost, it is possible for the UE to recover the lost information by using the CRC bits at the end of HS-SCCH Part 2 data. In one example, because the CRC used in the HS-SCCH transmission is 16 bits in length, the UE can recover up to 16 contiguous bits of erased or lost information bits (error bits) provided that the location of the lost bits is known. As the desense period 706 usually affects a contiguous part of HS-SCCH data (Part 1 and/or Part 2 data), and the UE is aware of the second RAT transmission timing, the lost HS-SCCH bits due to desense can be recovered by exploiting the CRC bits.

According to aspects of the disclosure, a UE can recover HS-SCCH data in two situations. If only the information bits (i.e., no CRC bit lost) are lost or corrupted, the UE can recover a block of erased or lost bits up to a predetermined length (e.g., 16 bits for 16 bits CRC). If some bits of both the information bits and CRC are lost (e.g., corrupted), the UE can recover a block of lost bits up to a predetermined length less than the CRC length (e.g., 12 bits in length for 16-bit CRC).

Figure 8:
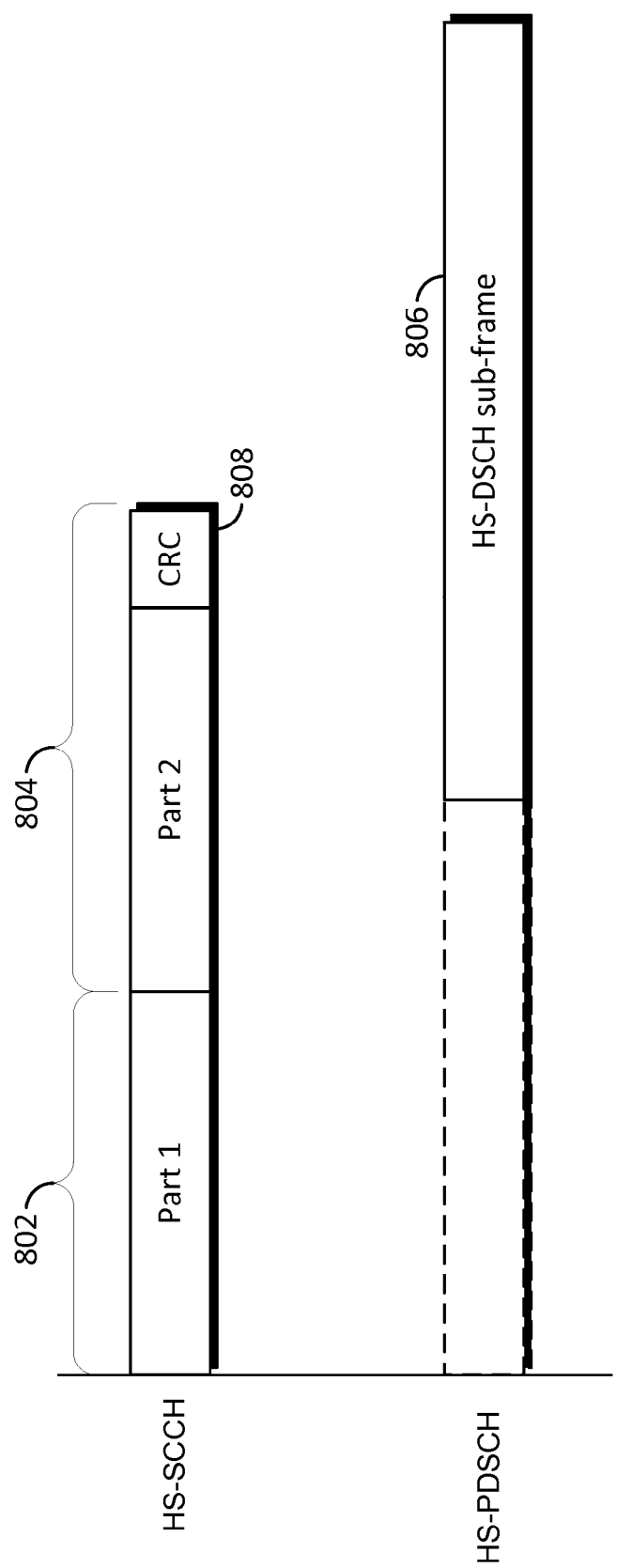
FIG. 8 is a drawing illustrating HS-SCCH and HS-DPSCH timing in accordance with aspects of the disclosure.

FIG. 8 is a drawing illustrating HS-SCCH and HS-DPSCH timing in accordance with aspects of the disclosure. The HS-SCCH TTI is one subframe in length, and is aligned with the Primary Common Control Physical Channel (PCCPCH). Each HS-SCCH PDU includes two portions (e.g., Part 1 802 and Part 2 804 in FIG. 8). The timing offset of the corresponding HS-PDSCH is two slots from HS-SCCH. Consequently, there is an overlap of one slot between an HS-SCCH subframe and the corresponding HS-PDSCH subframe. There is one slot offset between the end of HS-SCCH Part 1 802 and the beginning of HS-PDSCH subframe 806, so that a UE can decode the channelization and modulation information present in Part 1 prior to HS-PDSCH transmission. However, Part 1 of HS-SCCH is not CRC-protected. The CRC bits 808 are constructed from the information bits of both Part 1 and Part 2, and are transmitted at the end of Part 2. More information on HS-SCCH and HS-PDSCH may be found in the 3GPP TS 25.211, TS 25.212, and TS 25.214 documents, release 12, which are incorporated herein by reference in their entirety.

According to the 3GPP standards, HS-SCCH Part 1 contains 8 information bits of which 7 bits represent channelization information ($x_{ces}$) and 1 bit represents modulation ($x_{ms}$). A ⅓ convolutional-coded and punctured version of these 8 bits is XOR'ed with a ½ convolutional-coded and punctured version of the 16 bit H-RNTI to produce a 40-bit sequence, representing the 20 QPSK symbols transmitted over the first slot of HS-SCCH.

HS-SCCH Part 2 contains 13 information bits and 16 CRC bits. The 13 information bits represent 6 bits for transport block size (TBS) index ($x_{tbs}$), 3 bits for HARQ process id ($x_{hp}$), 3 bits for redundancy version ($x_{rv}$), and 1 bit for the new data indicator state ($x_{nd}$). The 16 CRC bits are generated from both Part 1 and Part 2 information bits, then inverted and XOR'ed with the H-RNTI. This is appended to the Part 2 information bits, and subsequently ⅓ convolutional-coded and punctured to 80 bits, representing the 40 QPSK symbols transmitted over the second and third slots of HS-SCCH. All $2^{13}$ (8192) information bit sequences are valid, although some restrictions apply for HS-SCCH orders. HS-SCCH order is a feature of Continuous Packet Connectivity (CPC) defined in the 3GPP standards.

A UE can simultaneously monitor up to 4 HS-SCCH channels, as indicated by higher layers. The UE de-masks and decodes the HS-SCCH Part 1 and Part 2 bits from the received symbols. If the decoded CRC bits are consistent with the decoded information bits and UE's H-RNTI, and if the decoded Part 1 bits corresponds to one of the valid 241 sequences, then the HS-SCCH for that OVSF is considered consistent. If an HS-SCCH order sequence for Part 1 is detected, a further check can be performed on the decoded Part 2 bits for validity. If 64-QAM (quadrature amplitude modulation) is not configured, and if the UE capability information element (IE) "support for different HS-SCCHs in contiguous TTIs" is false, and if the last TTI was not DTX'ed, then the UE only considers the winning HS-SCCH code index on the prior TTI (and discard all others). See Section 6A.1.1 in 3GPP TS 25.214 for more information. If inconsistency was detected in the CRC, the conventional HS-SCCH decoding scheme would discard the HS-SCCH and the associated HS-PDSCH.

In some DSDA operations (e.g., simultaneous transmit (TX) and receive (RX)), the transmission of one RAT (e.g., GSM) may adversely affect (e.g., desense) the HS-SCCH reception of the other RAT (e.g., HSDPA). Therefore, some bits of the HS-SCCH Part 1 and/or Part 2 may be lost or corrupted. However, the data of HS-PDSCH associated with the affected HS-SCCH may still be intact, and could be received. In such case, in accordance with aspects of the disclosure, a UE may perform a procedure to recover the lost data on the HS-SCCH (e.g., HS-SCCH of FIG. 8) by exploiting the property of its CRC bits after conventional decoding. In one example, the procedure may be performed according to the method 600 of FIG. 6 by a UE implemented as the apparatus 100 or any suitable apparatus.

Let H denote a parity check matrix corresponding to a certain CRC generator polynomial p(x). In a non-limiting example, when a CCITT-16 CRC is used for the HS-SCCH, the parity check matrix H may be represented as follows (see FIG. 11 or below):

$$H = \begin{bmatrix} 1 & 0 & 0 & 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 & 0 & 1 & 1 \\ 0 & 1 & 0 & 0 & 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 & 0 & 1 \\ 0 & 0 & 1 & 0 & 0 & 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 & 0 \\ 0 & 0 & 0 & 1 & 0 & 0 & 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 \\ 0 & 0 & 0 & 0 & 1 & 0 & 0 & 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 \\ 0 & 0 & 0 & 0 & 0 & 1 & 0 & 0 & 0 & 0 & 0 & 0 & 0 & 0 & 0 & 0 & 1 & 0 & 0 & 0 & 1 & 1 & 0 & 0 & 1 & 1 & 0 & 1 & 1 & 1 & 0 & 0 & 1 & 1 & 0 & 1 & 1 \\ 0 & 0 & 0 & 0 & 0 & 0 & 1 & 0 & 0 & 0 & 0 & 0 & 0 & 0 & 0 & 0 & 0 & 1 & 0 & 0 & 0 & 1 & 1 & 0 & 0 & 1 & 1 & 0 & 1 & 1 & 1 & 0 & 0 & 1 & 1 & 0 & 1 \\ 0 & 0 & 0 & 0 & 0 & 0 & 0 & 1 & 0 & 0 & 0 & 0 & 0 & 0 & 0 & 0 & 0 & 0 & 1 & 0 & 0 & 0 & 1 & 1 & 0 & 0 & 1 & 1 & 0 & 1 & 1 & 1 & 0 & 0 & 1 & 1 & 0 \\ 0 & 0 & 0 & 0 & 0 & 0 & 0 & 0 & 1 & 0 & 0 & 0 & 0 & 0 & 0 & 0 & 0 & 0 & 0 & 1 & 0 & 0 & 0 & 1 & 1 & 0 & 0 & 1 & 1 & 0 & 1 & 1 & 1 & 0 & 0 & 1 & 1 \\ 0 & 0 & 0 & 0 & 0 & 0 & 0 & 0 & 0 & 1 & 0 & 0 & 0 & 0 & 0 & 0 & 0 & 0 & 0 & 0 & 1 & 0 & 0 & 0 & 1 & 1 & 0 & 0 & 1 & 1 & 0 & 1 & 1 & 1 & 0 & 0 & 1 \\ 0 & 0 & 0 & 0 & 0 & 0 & 0 & 0 & 0 & 0 & 1 & 0 & 0 & 0 & 0 & 0 & 0 & 0 & 0 & 0 & 0 & 1 & 0 & 0 & 0 & 1 & 1 & 0 & 0 & 1 & 1 & 0 & 1 & 1 & 1 & 0 & 0 \\ 0 & 0 & 0 & 0 & 0 & 0 & 0 & 0 & 0 & 0 & 0 & 1 & 0 & 0 & 0 & 0 & 0 & 0 & 0 & 0 & 0 & 0 & 1 & 0 & 0 & 0 & 1 & 1 & 0 & 0 & 1 & 1 & 0 & 1 & 1 & 1 & 0 \\ 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 & 0 & 1 & 1 & 0 & 1 & 0 & 0 \\ 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 & 0 & 1 & 1 & 0 & 1 & 0 \\ 0 & 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 & 0 & 1 & 1 & 0 & 1 \\ 0 & 0 & 0 & 0 & 0 & 0 & 0 & 0 & 0 & 0 & 0 & 0 & 0 & 0 & 0 & 1 & 0 & 0 & 0 & 1 & 0 & 0 & 0 & 1 & 0 & 0 & 1 & 1 & 0 & 0 & 0 & 0 & 0 & 1 & 1 & 0 \end{bmatrix}$$

Right Most Significant Bit (MSB) Representation

Assuming a block of HS-SCCH bits are lost or corrupted (i.e., an error pattern including error bits), let S and K denote the start of the error pattern and the length of the error pattern in bits. An index set ε corresponding to the length-K error bits (lost or corrupted) for the HS-SCCH may be given as:

$$\varepsilon = \begin{cases} [S, S+1, \ldots, S+K-1] & S+K-1 < 22 \\ [S, S+1, \ldots, 21, 60-K-S, \ldots, 37] & S < 22 \text{ and } S+K-1 \geq 22 \end{cases}$$

In a DSDA example, the values of S and K can be determined based the timing when desense occurs. The reason for the heterogeneous index set representation is that the CRC generated from the CRC encoder is inverted first before attached to the end of a codeword for example in HSDPA systems. This operation makes the error pattern in the codeword non-contiguous after re-inverting the CRC, if the error pattern straddles or includes bits from both of the information segment and CRC segment. In one particular example, if only CRC bits are lost (e.g., S≥22), no explicit recovery operation is performed because the UE may make a decision on either discarding or accepting the HS-SCCH data based on the unaffected CRC bits.

Using the index set $\epsilon$, the sub-matrix of H consisting of only columns of H listed in the index set $\epsilon$, can be represented as a sub-matrix $H_\epsilon$. Similarly, the use of the subscript $\epsilon$ for a vector denotes the sub-vector with only entries listed in $\epsilon$. Throughout this disclosure, a vector can be indicated by an underlined symbol.

Let $\hat{\underline{c}} = \underline{c} + \underline{e}$ mod 2 represent the decoded HS-SCCH codeword as the linear combination of a transmitted codeword $\underline{c}$ and the error pattern $\underline{e}$. The recovery of the lost or corrupted HS-SCCH bits may be done by detecting the error pattern $\underline{e}$ and subtracting (removing) it from the decoded HS-SCCH codeword to obtain a recovered codeword, $\underline{c}_{rec} = \hat{\underline{c}} + \underline{e}$.

First, a UE computes the syndrome $\underline{s}$ for the decoded HS-SCCH codeword $\hat{\underline{c}}$ as shown by Equation 0.

$$\underline{s} = H\hat{\underline{c}} \quad (0)$$

Because $H\underline{c} = 0$ for a valid codeword, the decoded codeword $\hat{\underline{c}}$ is then considered valid if $\underline{s} = 0$ (zero vector). On the other hand, if $\underline{s} \neq 0$ (non-zero vector), given the error pattern $\underline{e}$, the syndrome $\underline{s}$ can be represented as a linear system as shown by Equation 1. A linear system includes a set of linear equations, also may be called a system of equations.

$$H_\epsilon \underline{e}_\epsilon = \underline{s} \quad (1)$$

Because $\underline{e}_{\bar{\epsilon}} = 0$ as by definition, errors happen only in locations listed in the index set $\epsilon$. It is because $\epsilon$ is the index set of error bits, therefore the bits in its complement does not contain any errors. If the linear system of Equation 1 has a unique solution denoted as $\hat{\underline{e}}$, the recovered codeword can then be reconstructed as shown by Equation 2.

$$\underline{c}_{rec} = \hat{\underline{c}} + \hat{\underline{e}} \quad (2)$$

Using the definition of the index set $\epsilon$ given above, an exhaustive search shows the sub-matrix $H_\epsilon$ is full rank in Equation 1 (i.e., Equation 1 has a unique solution) if and only if $K \leq 16$, when $S + K - 1 < 22$, or $K \leq 12$, when $S < 22$ and $S + K - 1 \geq 22$.

In one aspect of the disclosure, K may be fixed as K=16 for recovery of information bits only. In another aspect of the disclosure, K may be fixed as K=12 for recovery of information bits and CRC bits. The above described principle and theory of codeword recovery procedure may be extended to other applications other than recovery of HS-SCCH codeword and CRC of different sizes and types.

Information Bits Only Recovery Example

In this example, it is assumed that only the information bits of an HS-SCCH transmission are lost. Therefore, K may be fixed as K=16, then the index set $\epsilon$ becomes $\epsilon = [S, S+1, \ldots, S+15]$. It can be verified that for all $S \in \{1, \ldots, 5\}$, the sub-matrix $H_\epsilon$ is a 16×16 matrix with full rank. Hence Equation 1 may be solved directly by various commonly known methods (e.g., matrix inversion, Gaussian elimination, etc.). The solution of Equation 1 then serves as an estimate of the error pattern $\underline{e}$ that can be used to recover the HS-SCCH lost bits using Equation 2.

Information Bits and CRC Bits Recovery Example

In this example, it is assumed that both the information bits and CRC bits of the HS-SCCH are lost or corrupted. Therefore, K may be fixed as K=12; and the index set $\epsilon$ becomes $\epsilon = [S, S+1, \ldots, 21] \cup [48-S, \ldots, 37]$. It can be verified that for all $S \in \{11, \ldots, 21\}$, the sub-matrix $H_\epsilon$ is a 16×12 matrix with full rank. Hence, Equation 1 represents an over-determined linear system that may have a unique solution. A linear system is over-determined if there are more equations than unknown variables. In this case, the number of equations and the number of unknowns are 16 and 12, respectively. If such a unique solution exists, it may be found by, for example, Gaussian elimination, Moore-Penrose pseudoinverse, or other commonly known linear algebra techniques. The solution then serves as an estimate of the error pattern $\underline{e}$ that can be used to recover the HS-SCCH lost bits using Equation 2.

To simplify the implementation, in one aspect of the disclosure, one may solve the linear system by working on only 12 out of the 16 equations corresponding to the 12 independent rows of $H_\epsilon$ and then recalculate the syndrome after recovery. If the recomputed syndrome is all-zero, then the solution is considered valid. By examining the sub-matrix $H_\epsilon$ with different S, the index of independent rows of $H_\epsilon$ may be given in the Table 1, as one example.

TABLE 1

List of linearly independent rows in $H_\epsilon$ with various S

| S | Index of independent rows of partial parity check matrix $H_\epsilon$ $11 \leq S < 22$, $K = 12$ | | | | | | | | | | |
|---|---|---|---|---|---|---|---|---|---|---|---|
| 11 | 1 | 6 | 7 | 8 | 9 | 10 | 11 | 12 | 13 | 14 | 15 | 16 |
| 12 | 1 | 2 | 6 | 8 | 9 | 10 | 11 | 12 | 13 | 14 | 15 | 16 |
| 13 | 1 | 2 | 3 | 8 | 9 | 10 | 11 | 12 | 13 | 14 | 15 | 16 |
| 14 | 1 | 2 | 3 | 4 | 8 | 10 | 11 | 12 | 13 | 14 | 15 | 16 |
| 15 | 1 | 2 | 3 | 4 | 5 | 10 | 11 | 12 | 13 | 14 | 15 | 16 |
| 16 | 1 | 2 | 3 | 4 | 5 | 6 | 10 | 11 | 13 | 14 | 15 | 16 |
| 17 | 1 | 2 | 3 | 4 | 5 | 6 | 7 | 10 | 13 | 14 | 15 | 16 |
| 18 | 1 | 2 | 3 | 4 | 5 | 6 | 7 | 8 | 13 | 14 | 15 | 16 |
| 19 | 1 | 2 | 3 | 4 | 5 | 6 | 7 | 8 | 9 | 13 | 14 | 15 |
| 20 | 1 | 2 | 3 | 4 | 5 | 6 | 7 | 8 | 9 | 10 | 13 | 14 |
| 21 | 1 | 2 | 3 | 4 | 5 | 6 | 7 | 8 | 9 | 10 | 11 | 13 |

Note:
The choice of independent rows used for solving Equation (2) is not unique. This table provides only one valid choice out of many possibilities.

Figure 9:
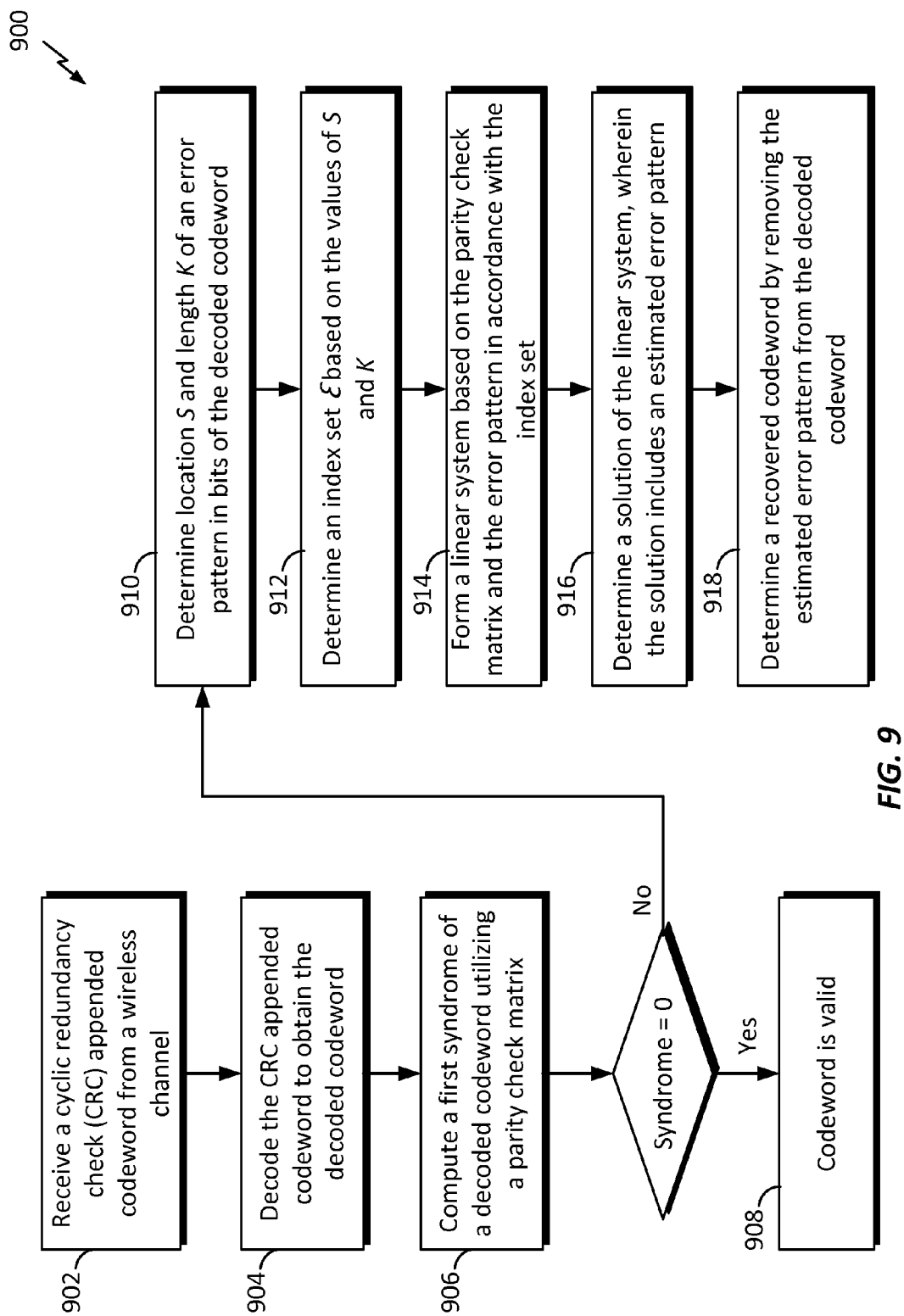
FIG. 9 is a flow chart illustrating a method of recovering error bits of an HS-SCCH codeword in accordance with aspects of the disclosure.

FIG. 9 is a flow chart illustrating a method 900 of recovering error bits of a codeword in accordance with aspects of the disclosure. The method 900 may be performed by any of the UEs illustrated in FIGS. 1, 2, 3, and/or 5 or any suitable apparatus. In one particular example, a UE may utilize a first radio 112 for transmission (e.g., transmission 704 of FIG. 7) and a second radio 114 for reception (e.g., reception 702 of FIG. 7). However, a transmission of the first radio may desense the data (e.g., an HS-SCCH data) received by the second radio. At block 902, the UE receives a cyclic redundancy check (CRC) appended codeword from a wireless channel (e.g., HS-SCCH). At block 904, the UE may utilize a codeword decoder 127 to decode the CRC appended codeword to obtain the decoded codeword.

At block 906, the UE computes a first syndrome of a decoded codeword utilizing a parity check matrix H. In one example, the decoded codeword may be an HS-SCCH codeword $\underline{c}$ received from an HS-SCCH as illustrated in FIG. 8. The UE may decode the CRC appended codeword utilizing a codeword decoder 127 of FIG. 1, and calculate the syndrome of the decoded codeword utilizing a syndrome calculation block 122.

If the syndrome is determined to be zero, the method proceeds to block 908; otherwise, the method proceeds to block 910. As described above, when the syndrome is zero, the decoded HS-SCCH codeword $\underline{c}$ is considered valid. When the syndrome is non-zero, the decoded codeword $\underline{c}$ contains the transmitted codeword (i.e., the correct codeword) but with an error pattern. At block 910, the UE determines the location S and length K of an error pattern in bits of the decoded codeword. In one example, the UE may utilize an error pattern location block 130 (see FIG. 1) to determine the location S and length K based on a desense timing 132 obtained from the second radio 114. The location S indicates the start of the error pattern.

At block 912, the UE may utilize an index set determination block 124 to determine an index set $\epsilon$ based on the values of S and K. In one aspect of the disclosure, the index set $\epsilon$ may be the same index set $\epsilon$ described above and reproduced below.

$$\varepsilon = \begin{cases} [S, S+1, \ldots, S+K-1] & S+K-1 < 22 \\ [S, S+1, \ldots, 21, 60-K-S, \ldots, 37] & S < 22 \text{ and } S+K-1 \geq 22 \end{cases}$$

At block 914, the UE forms a linear system based on the parity check matrix and the error pattern in accordance with the index set $\epsilon$. In one example, the UE may utilize a linear system block 134 to determine a linear system $H_\epsilon \underline{e}_\epsilon = \underline{s}$ (e.g., see Equation 1 above). The linear system may include the parity check equations of FIG. 6.

At block 916, the UE determines a solution $\underline{\hat{e}}$ of the linear system, wherein the solution includes an estimated error pattern. In one example, the UE may utilize the linear system block 134 to find a solution of the linear system. The estimated error pattern may be the error vector described in block 608 of FIG. 6. The estimated error pattern may be the same as that described in the above codeword recovery process.

At block 918, the UE can determine a recovered codeword by removing the estimated error pattern from the decoded codeword. For example, the UE may utilize the codeword recovery block 120 to determine the recovered codeword by removing the estimated error pattern from the transmitted codeword (e.g., $\underline{c}_{rec} = \underline{\hat{c}} + \underline{\hat{e}}$).

Figure 10:
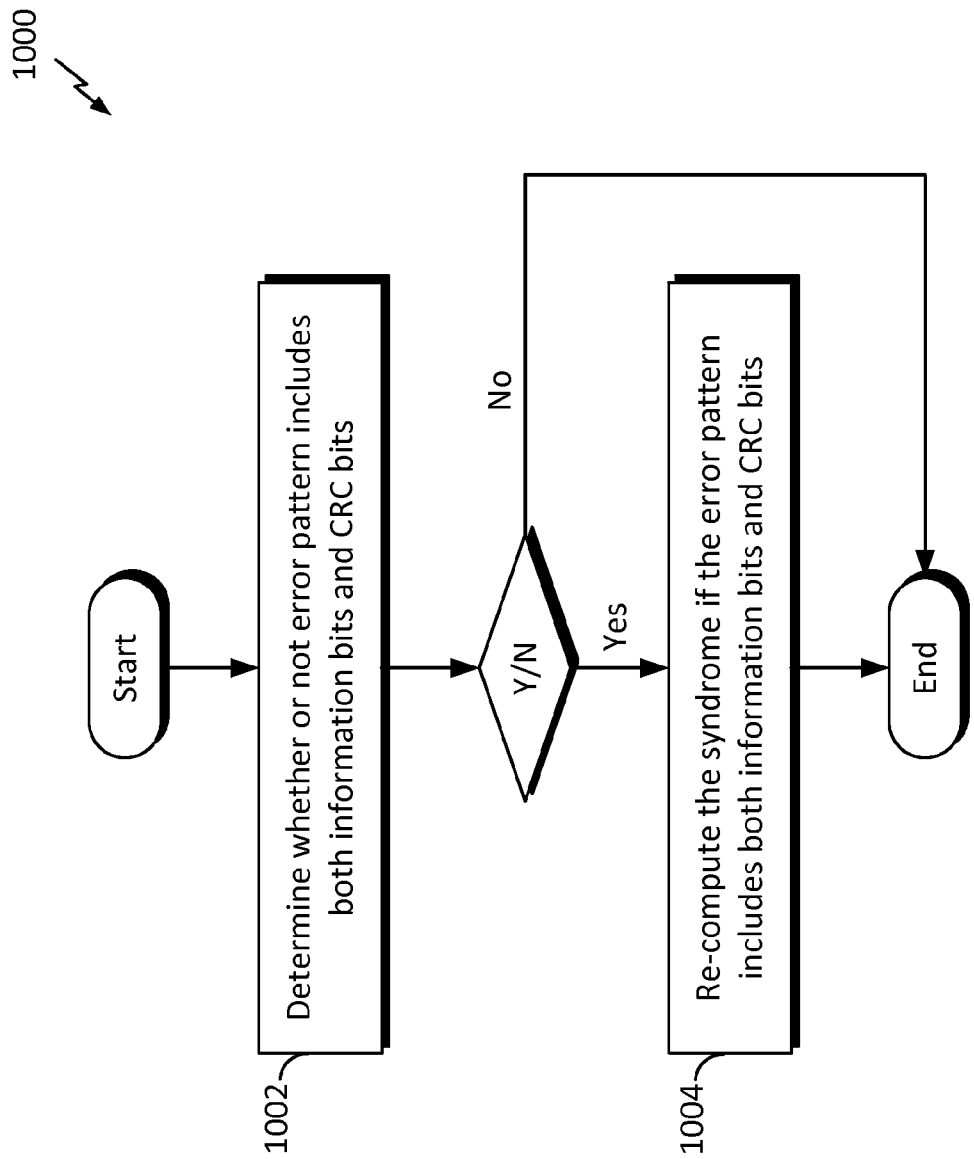
FIG. 10 is a flow chart illustrating a method of re-computing a syndrome to validate a recovered codeword in accordance with an aspect of the disclosure.

FIG. 10 is a flow chart illustrating a method 1000 of re-computing a syndrome to validate a recovered codeword in accordance with an aspect of the disclosure. The method 1000 may be performed by any of the UEs illustrated in FIGS. 1, 2, 3, and/or 5 or any suitable apparatus to validate or verify a recovered CRC appended codeword that may be recovered using the method 900. At block 1002, the UE determines whether or not the error pattern includes both information bits and CRC bits based on the values of S and K (e.g., S<22 and S+K−1≥22). The error pattern may be the same as the estimated error pattern determined using the method 900. If the error pattern includes both information bits and CRC bits, the method 1000 proceeds to block 1004 where the UE can utilize the syndrome calculation block 122 to re-compute the syndrome to verify that the solution is valid. The codeword is valid is the re-computed syndrome is zero (i.e., $\underline{s} = \underline{0}$).

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-8 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-8 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of recovering a codeword in wireless communications, comprising:
   receiving a cyclic redundancy check (CRC) appended codeword from a wireless channel;
   decoding the CRC appended codeword to obtain the decoded codeword;
   computing a first syndrome of the decoded codeword utilizing a parity check matrix;
   if the first syndrome is non-zero, determining a location S and a length K of an error pattern in bits of the decoded codeword;
   determining an index set ϵ based on the values of S and K;
   forming a linear system based on the parity check matrix and the error pattern in accordance with the index set ϵ;
   determining a solution of the linear system, wherein the solution comprises an estimated error pattern; and
   determining a recovered codeword by removing the estimated error pattern from the decoded codeword.

2. The method of claim 1, wherein the wireless channel comprises a high-speed shared control channel (HS-SCCH).

3. The method of claim 1, wherein the forming the linear system comprises:
   determining a sub-matrix of the parity check matrix based on the index set;
   determining a sub-vector of the error pattern based on the index set; and
   forming the linear system as a product of the sub-matrix and the sub-vector.

4. The method of claim 1, wherein the index set ϵ is defined as:

$$\varepsilon = \begin{cases} [S, S+1, \ldots, S+K-1] & S+K-1 < 22 \\ [S, S+1, \ldots, 21, 60-K-S, \ldots, 37] & S < 22 \text{ and } S+K-1 \geq 22 \end{cases}.$$

5. The method of claim 4, wherein if the error pattern comprises information bits and excludes cyclic redundancy check (CRC) bits, setting the length K to be less than or equal to 16.

6. The method of claim 4, wherein if the error pattern comprises information bits and cyclic redundancy check (CRC) bits, setting the length K to be less than or equal to 12.

7. The method of claim 1, further comprising:
   if the error pattern comprises information bits and cyclic redundancy check (CRC) bits, computing a second syndrome of the recovered codeword utilizing the parity check matrix; and
   if the second syndrome is all-zero, determining that the solution of the linear system is valid.

8. An apparatus configured to recover a codeword in wireless communications, comprising:
   a codeword decoder configured to receive a cyclic redundancy check (CRC) appended codeword from a wireless channel and decode the CRC appended codeword to obtain the decoded codeword;
   a syndrome calculation block configured to compute a first syndrome of the decoded codeword utilizing a parity check matrix;
   an error pattern location block configured to if the first syndrome is non-zero, determine a location S and a length K of an error pattern in bits of the decoded codeword;
   an index set determination block configured to determine an index set ϵ based on the values of S and K;
   a linear system block configured to:
      form a linear system based on the parity check matrix and the error pattern in accordance with the index set ϵ;
      determine a solution of the linear system, wherein the solution comprises an estimated error pattern; and
      determine a recovered codeword by removing the estimated error pattern from the decoded codeword.

9. The apparatus of claim 8, wherein the wireless channel comprises a high-speed shared control channel (HS-SCCH).

10. The apparatus of claim 8, wherein the linear system block is further configured to:
    determine a sub-matrix of the parity check matrix based on the index set;
    determine a sub-vector of the error pattern based on the index set; and
    form the linear system as a product of the sub-matrix and the sub-vector.

11. The apparatus of claim 8, wherein the index set ϵ is defined as:

$$\varepsilon = \begin{cases} [S, S+1, \ldots, S+K-1] & S+K-1 < 22 \\ [S, S+1, \ldots, 21, 60-K-S, \ldots, 37] & S < 22 \text{ and } S+K-1 \geq 22 \end{cases}.$$

12. The apparatus of claim 11, wherein the error pattern location block is further configured to if the error pattern comprises information bits and excludes cyclic redundancy check (CRC) bits, set the length K to be less than or equal to 16.

13. The apparatus of claim 11, wherein the error pattern location block is further configured to if the error pattern comprises information bits and cyclic redundancy check (CRC) bits, set the length K to be less than or equal to 12.

14. The apparatus of claim 8, wherein the syndrome calculation block is further configured to:
    if the error pattern comprises information bits and cyclic redundancy check (CRC) bits, compute a second syndrome of the recovered codeword utilizing the parity check matrix; and
    if the second syndrome is all-zero, determine that the solution of the linear system is valid.

15. An apparatus configured to recover a codeword in wireless communications, comprising:
    means for receiving a cyclic redundancy check (CRC) appended codeword from a wireless channel;
    means for decoding the CRC appended codeword to obtain the decoded codeword;
    means for computing a first syndrome of the decoded codeword utilizing a parity check matrix;
    means for if the first syndrome is non-zero, determining a location S and a length K of an error pattern in bits of the decoded codeword;
    means for determining an index set ϵ based on the values of S and K;
    means for forming a linear system based on the parity check matrix and the error pattern in accordance with the index set ϵ;

means for determining a solution of the linear system, wherein the solution comprises an estimated error pattern; and means for determining a recovered codeword by removing the estimated error pattern from the decoded codeword.

16. The apparatus of claim 15, wherein the wireless channel comprises a high-speed shared control channel (HS-SCCH).

17. The apparatus of claim 15, wherein the means for forming the linear system is configured to:
   determine a sub-matrix of the parity check matrix based on the index set;
   determine a sub-vector of the error pattern based on the index set; and
   form the linear system as a product of the sub-matrix and the sub-vector.

18. The apparatus of claim 15, wherein the index set $\epsilon$ is defined as:

$$\varepsilon = \begin{cases} [S, S+1, \ldots, S+K-1] & S+K-1 < 22 \\ [S, S+1, \ldots, 21, 60-K-S, \ldots, 37] & S < 22 \text{ and } S+K-1 \geq 22 \end{cases}.$$

19. The apparatus of claim 18, wherein the means for determining the location S and the length K is configured to if the error pattern comprises information bits and excludes cyclic redundancy check (CRC) bits, set the length K to be less than or equal to 16.

20. The apparatus of claim 18, wherein the means for determining the location S and the length K is configured to if the error pattern comprises information bits and cyclic redundancy check (CRC) bits, set the length K to be less than or equal to 12.

21. The apparatus of claim 15, wherein the means for computing the first syndrome is further configured to:
   if the error pattern comprises information bits and cyclic redundancy check (CRC) bits, compute a second syndrome of the recovered codeword utilizing the parity check matrix; and
   if the second syndrome is all-zero, determine that the solution of the linear system is valid.

22. A non-transitory computer-readable medium comprising instructions for recovering a codeword in wireless communications, the instructions cause an apparatus to:
   receive a cyclic redundancy check (CRC) appended codeword from a wireless channel;
   decode the CRC appended codeword to obtain the decoded codeword;
   compute a first syndrome of the decoded codeword utilizing a parity check matrix;
   if the first syndrome is non-zero, determine a location S and a length K of an error pattern in bits of the decoded codeword;
   determine an index set $\epsilon$ based on the values of S and K;
   form a linear system based on the parity check matrix and the error pattern in accordance with the index set $\epsilon$;
   determine a solution of the linear system, wherein the solution comprises an estimated error pattern; and
   determine a recovered codeword by removing the estimated error pattern from the decoded codeword.

23. The computer-readable medium of claim 22, wherein the wireless channel comprises a high-speed shared control channel (HS-SCCH).

24. The computer-readable medium of claim 22, wherein for forming the linear system, the instructions further cause the apparatus to:
   determine a sub-matrix of the parity check matrix based on the index set;
   determine a sub-vector of the error pattern based on the index set; and
   form the linear system as a product of the sub-matrix and the sub-vector.

25. The computer-readable medium of claim 22, wherein the index set $\epsilon$ is defined as:

$$\varepsilon = \begin{cases} [S, S+1, \ldots, S+K-1] & S+K-1 < 22 \\ [S, S+1, \ldots, 21, 60-K-S, \ldots, 37] & S < 22 \text{ and } S+K-1 \geq 22 \end{cases}.$$

26. The computer-readable medium of claim 25, wherein for determining the location S and the length K, the instructions further cause the apparatus to if the error pattern comprises information bits and excludes cyclic redundancy check (CRC) bits, set the length K to be less than or equal to 16.

27. The computer-readable medium of claim 25, wherein for determining the location S and the length K, the instructions further cause the apparatus to if the error pattern comprises information bits and cyclic redundancy check (CRC) bits, set the length K to be less than or equal to 12.

28. The computer-readable medium of claim 22, wherein for computing the first syndrome, the instructions further cause the apparatus to:
   if the error pattern comprises information bits and cyclic redundancy check (CRC) bits, compute a second syndrome of the recovered codeword utilizing the parity check matrix; and
   if the second syndrome is all-zero, determine that the solution of the linear system is valid.

* * * * *